(12) United States Patent
Nomura et al.

(10) Patent No.: US 8,219,586 B2
(45) Date of Patent: Jul. 10, 2012

(54) SUPPORT APPARATUS AND METHOD

(75) Inventors: Tomokazu Nomura, Kawasaki (JP); Hideaki Katagiri, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/215,784

(22) Filed: Aug. 23, 2011

(65) Prior Publication Data

US 2012/0054229 A1    Mar. 1, 2012

(30) Foreign Application Priority Data

Aug. 30, 2010   (JP) ................................. 2010-191901

(51) Int. Cl.
G06F 17/30    (2006.01)
G06F 17/50    (2006.01)

(52) U.S. Cl. ....................................... 707/790; 716/100
(58) Field of Classification Search .................. 707/790; 716/100
See application file for complete search history.

(56) References Cited

U.S. PATENT DOCUMENTS 8,082,345 B2 * 12/2011 Ettle et al. ..................... 709/226
2005/0188339 A1 * 8/2005 Anderson ........................ 716/11
2008/0222593 A1 * 9/2008 Fujimori ......................... 716/15

FOREIGN PATENT DOCUMENTS

| JP | 2-25980 | 1/1990 |
|---|---|---|
| JP | 5-290113 | 11/1993 |
| JP | 2008-193001 | 8/2008 |

* cited by examiner

Primary Examiner — Cheryl Lewis
(74) Attorney, Agent, or Firm — Fujitsu Patent Center

(57) ABSTRACT

A design support apparatus includes a database storage storing a first database including respective logical connection information for a first-layer circuit and a second-layer circuit laid lower than the first-layer circuit, both provided in a circuit under design, a file generator that traces logical connection type identification information identifying types of logical connections from the first-layer circuit to the second-layer circuit based on the logical connection information included in the first database, and generates a layer terminal information file including layer terminal code information associating layer terminals in the second-layer circuit with layer terminal codes having trace information regarding the logical connection type identification information, and a database generator that generates a second database based on the generated layer terminal information file for the second-layer circuit including placement information for a plurality of cells included in the circuit and wiring information for wiring among the plurality of cells.

10 Claims, 21 Drawing Sheets

FIG. 9

14a USER SETTINGS FILE

```
OutputUnit
   All
   Module    EUNIT
   Instance  C0/EU
   Instance  C1/EU/  1,2
   Instance  C2/EU/  3-5
   Instance  C3/EU/  6-
BlackBoxUnit
   Module    IUNIT
   Instance  C0/IU
CheckKind
   All
   CrosstalkNoiseCheck
   TrfCheck
```

FIG. 18
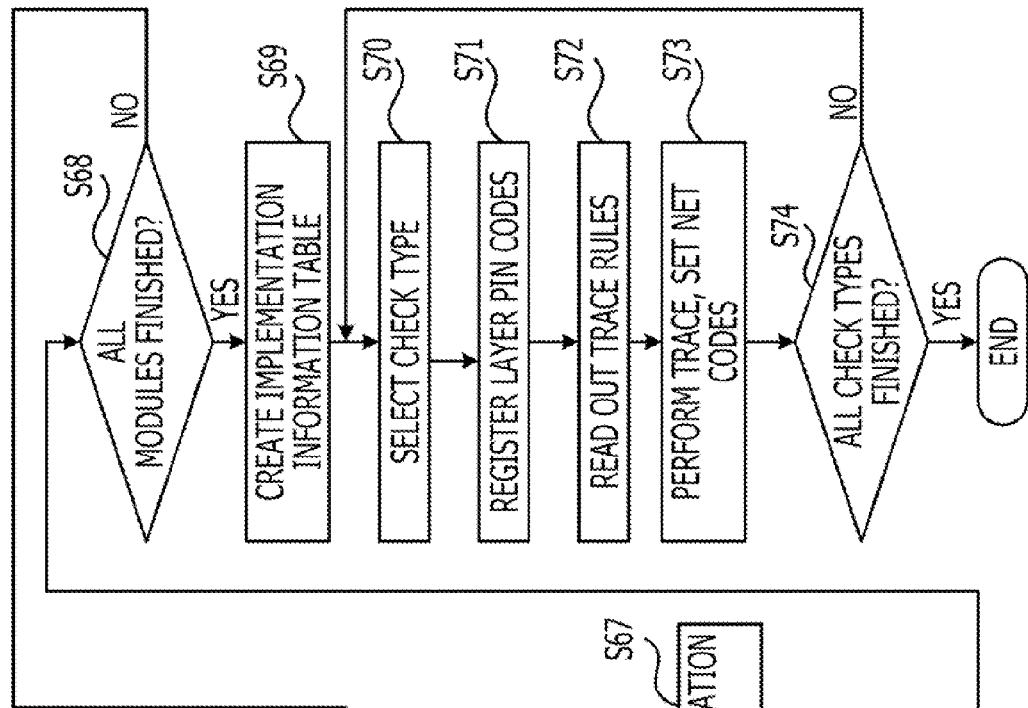
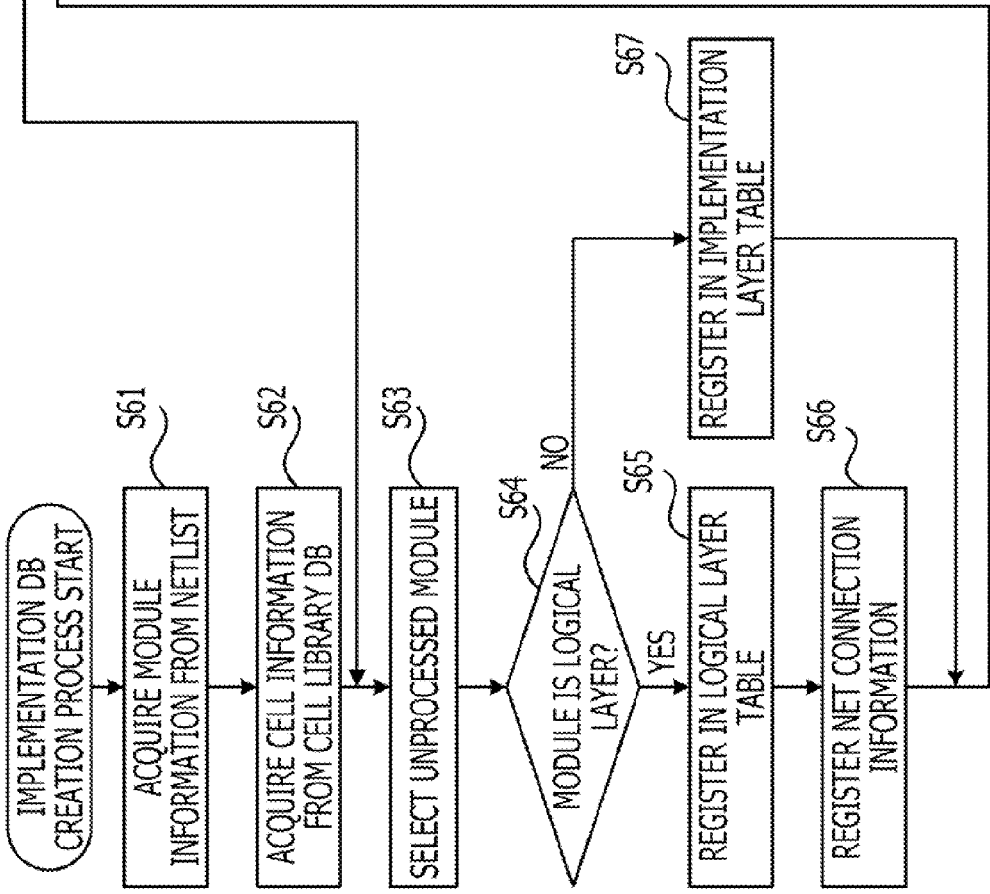

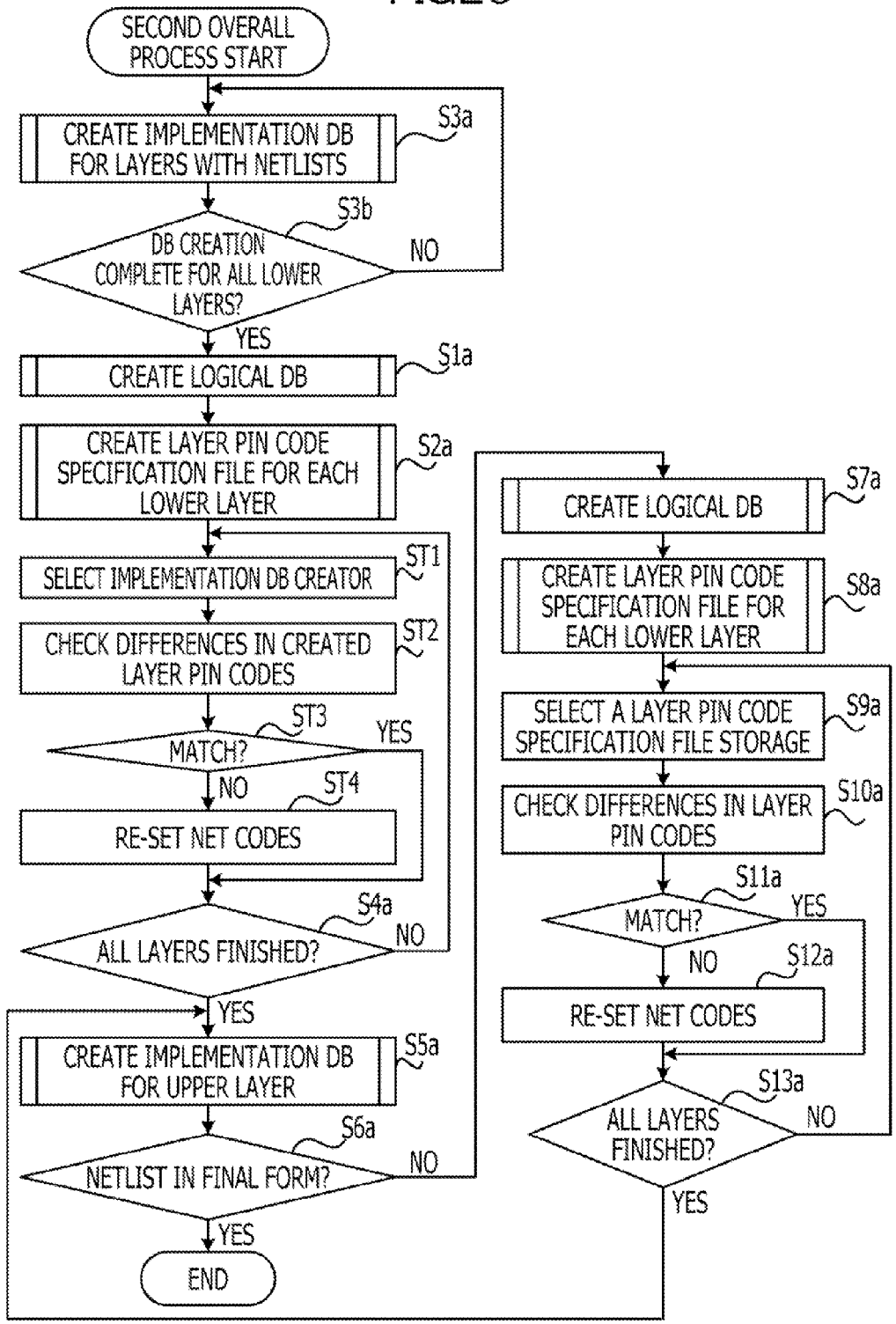

SUPPORT APPARATUS AND METHOD

CROSS-REFERENCE TO RELATED APPLICATIONS

This application is based upon and claims priority to prior Japanese Patent Application No. 2010-191901 filed on Aug. 30, 2010 in the Japan Patent Office, the entire contents of which are incorporated herein by reference.

FIELD

An embodiment of the present invention discussed herein relates to a design support apparatus and method.

BACKGROUND

Recently, as a Large Scale Integrated circuit (LSI) increases in its scale, the LSI has become mainstream for layered LSI design to be conducted by using a plurality of layers. With layered LSI design, there is known technology that ascertains net connection information between layers by assigning codes (net codes) that identify net types (such as for clock signals and for test signals, etc.) to logical connection information (logical nets) that define connections between the terminals of respective elements such as transistors, for example.

The assignment of net codes is for example conducted for each layer on the basis of layer pin codes that take into account the effects of other layers on the layer pins of the current layer. Layer pin codes are codes that set layer pins, and include net code trace information.

However, if layer pin codes are assigned manually, there is a problem in that layer-to-layer interface consistency may not be obtained due to incorrect layer pin code specification. Literature related to design support apparatus and design support methods is given in the patent document listed below.

[Patent Document 1] Japanese Laid-open Patent Publication No. 5-290113

[Patent Document 2] Japanese Laid-open Patent Publication No. 2-025980

SUMMARY

According to an aspect of the invention, a design support apparatus includes a database storage storing a first database including respective logical connection information for a first-layer circuit and a second-layer circuit laid lower than the first-layer circuit, both provided in a circuit under design, a file generator that traces logical connection type identification information identifying types of logical connections from the first-layer circuit to the second-layer circuit based on the logical connection information included in the first database, and generates a layer terminal information file including layer terminal code information associating layer terminals in the second-layer circuit with layer terminal codes having trace information regarding the logical connection type identification information, and a database generator that generates a second database based on the generated layer terminal information file for the second-layer circuit including placement information for a plurality of cells included in the circuit under design and wiring information for wiring among the plurality of cells.

BRIEF DESCRIPTION OF DRAWINGS

FIG. 9 illustrates a user settings file;

FIG. 18 is a flowchart illustrating a packaging DB creation process;

FIG. 20 is a flowchart illustrating a second overall process.

DESCRIPTION OF EMBODIMENTS

Hereinafter, embodiments will be explained in detail and with reference to the drawings. First, a design support apparatus in accordance with an embodiment will be explained, and after that, embodiments will be explained more specifically.

<First Embodiment>

Figure 1:
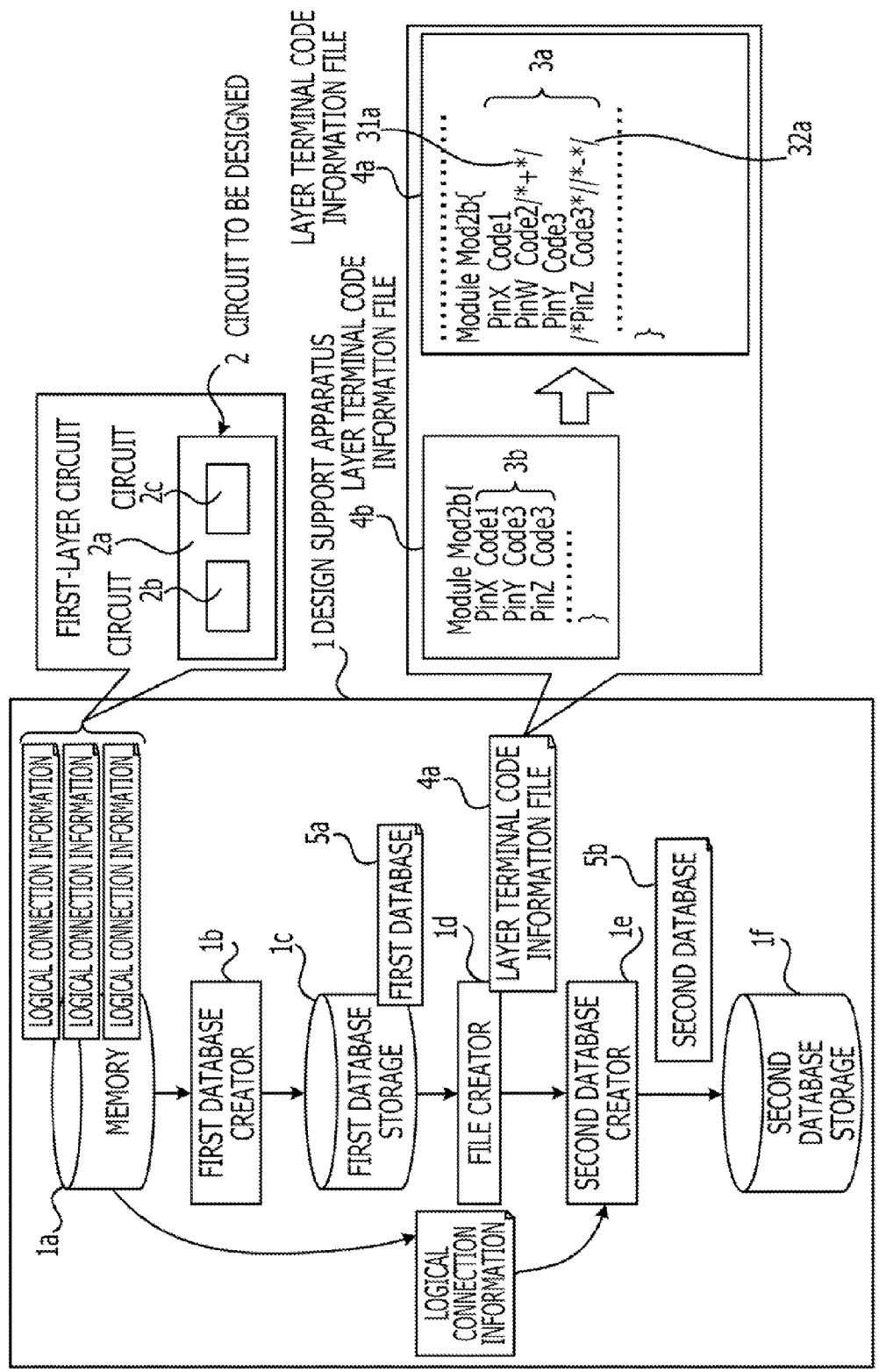
FIG. 1 schematically illustrates a design support apparatus in accordance with a first embodiment.

FIG. 1 schematically illustrates a design support apparatus in accordance with a first embodiment. A design support apparatus (e.g., a computer) 1 in accordance with the first embodiment is an apparatus that sets layer pin codes for each layer of a circuit under design.

In FIG. 1, a circuit under design 2 is illustrated. This circuit under design 2 includes a first-layer circuit 2a, and two second-layer circuits 2b and 2c. The second layer is a lower layer below the first layer. The design support apparatus 1 includes memory 1a, a first database creator (e.g., a logical database creator) 1b, first database storage 1c, a file creator 1d, a second database creator (e.g., a packaging database creator) 1e, and second database storage 1f.

The memory 1a stores logical connection information (e.g., logical nets defining connections between elements) for the first-layer circuit 2a provided in the circuit under design 2, and logical connection information for the second-layer circuits 2b and 2c in the lower layer below the first layer.

Also, the memory 1a is, for example, able to store a layer terminal code information file 4b including layer terminal code information created by a designer in which layer terminals of the first-layer circuit 2a are associated with logical connection type identification information (e.g., net codes) that identify types of logical connections of the layer terminals. The contents of a layer terminal code information file 4b will be discussed later.

The first database creator 1b creates a first database 5a that includes respective logical connection information for the first-layer circuit 2a and the second-layer circuits 2b and 2c stored in the memory 1a. Herein, a layer terminal code information file 4b may also be included in the first database 5a.

The first database creator 1b stores a created first database 5a in the first database storage 1c. The file creator 1d, on the basis of logical connection information included in the first database 5a, creates a layer terminal code information file including layer terminal code information in which layer terminals of the second-layer circuits 2b and 2c are associated with layer terminal codes that include trace information for logical connection type identification information. The file creator 1d creates a layer terminal code information file by tracing the logical connection type identification information from the first-layer circuit 2a to the second-layer circuits 2b and 2c.

In FIG. 1, a layer terminal code information file 4a including layer terminal code information 3a for the second-layer circuit 2b is illustrated as an example. In the layer terminal code information file 4a, the module name of the circuit 2b is Mod2b, and the file is illustrated as having a PinX Code1, a PinW Code2, and a PinY Code3 as the layer terminal code information 3a. Herein, PinX, PinW, and PinY are layer terminals, while Code1, Code2, and Code3 are layer terminal codes including trace information for logical connection type identification information.

Also, when the first database 5a additionally includes a layer terminal code information file 4b, the file creator 1d is able to set identification information identifying differences between layer terminal code information obtained by tracing and layer terminal code information in a layer terminal code information file created in advance as comments expressed between "/*" and "*/" symbols in the created layer terminal code information 3a.

In FIG. 1, a layer terminal code information file 4b including layer terminal code information 3b created in advance is illustrated. In the layer terminal code information file 4a, identification information 31a and 32a identifying differences between the PinX Code1, PinY Code3, and PinZ Code3 in the layer terminal code information 3b and the layer pin codes PinX Code1, PinW Code2, and PinY Code3 obtained by tracing is set as comments expressed between "/*" and "/*" symbols. The identification information 31a expressed by "/*+*/" is information identifying that a layer pin code PinW Code2 has been newly added to the layer terminal code information 3a. The identification information 32a expressed by "/*−*/" is information identifying that a layer pin code PinZ Code 3 has been deleted from the layer terminal code information 3a.

The second database creator 1e creates a second database 5b for the second-layer circuit 2b that includes placement information for cells included in the circuit under design 2 and cell-to-cell wiring information on the basis of a created layer terminal code information file 4a and logical connection information for the second-layer circuit 2b. Also, the second database creator 1e creates a second database 5b for the second-layer circuit 2c that includes placement information for cells included in the circuit under design 2 and cell-to-cell wiring information on the basis of a layer terminal code information file created for the second-layer circuit 2c and logical connection information for the second-layer circuit 2c.

After the creating, the second database creator 1e is able to create a third database for the first-layer circuit 2a that includes placement information for cells included in the circuit under design 2 and cell-to-cell wiring information on the basis of the second databases 5b respectively created for the second-layer circuits 2b and 2c and the logical connection information for the first-layer circuit 2a stored in the memory 1a.

According to this design support apparatus 1, a first database 5a that includes logical nets for all circuits is created by a first database creator 1b. By performing a trace on the first database 5a to create layer terminal code information, a layer terminal code information file 4a including layer terminal code information that expresses correct connection relationships between layers is obtained. Consequently, the reliability of assigned net codes can be increased by using this layer terminal code information file 4a to assign net codes.

Herein, the first database creator 1b, the file creator 1d, and the second database creator 1e may be realized according to functions provided by a central processing unit (CPU) included in the design support apparatus 1. Also, the memory 1a, the first database storage 1c, and the second database storage 1f may be realized according to data storage areas provided by random access memory (RAM) or a hard disk drive (HDD) included in the design support apparatus 1.

Hereinafter, embodiments will be explained more specifically.

<Second Embodiment>

Figure 2:
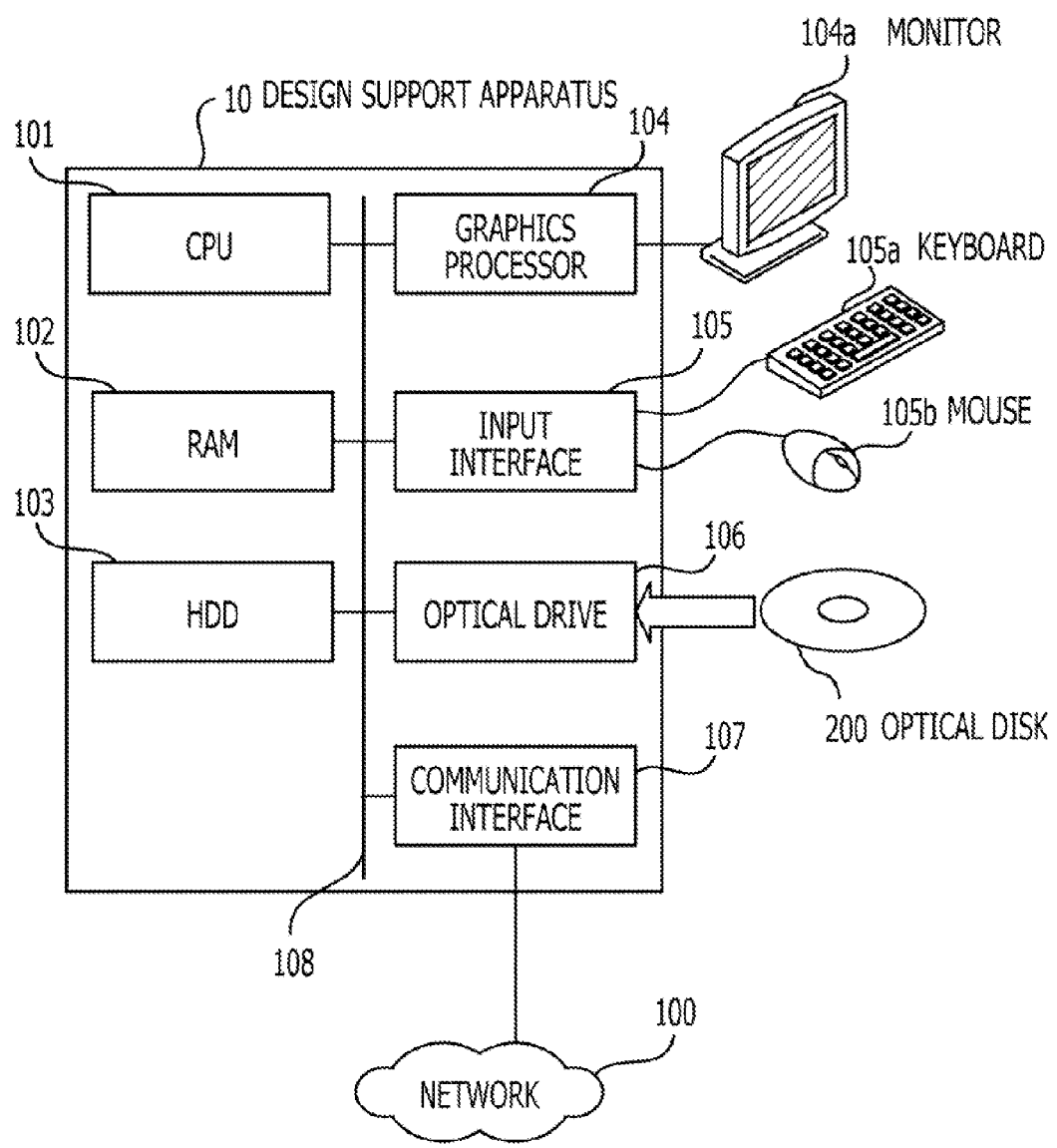
FIG. 2 illustrates an example hardware configuration of a design support apparatus in accordance with a second embodiment.

FIG. 2 illustrates an example hardware configuration of a design support apparatus in accordance with a second embodiment.

In a design support apparatus 10, overall apparatus operation is controlled by a CPU 101. RAM 102 and a plurality of peripheral equipment are connected to the CPU 101 via a bus 108. The RAM 102 is used as a primary memory device of the design support apparatus 10. At least part of operating system (OS) programs or application programs executed by the CPU 101 are temporarily stored in the RAM 102. Also, various data required for processing by the CPU 101 is stored in the RAM 102.

The peripheral equipment connected to the bus 108 may include a hard disk drive (HDD) 103, a graphics processor 104, an input interface 105, an optical drive 106, and a communication interface 107.

The HDD 103 magnetically writes and reads data to and from an internally housed disk. The HDD 103 is used as a secondary memory device of the design support apparatus 10. OS, application programs, and various data are stored in the HDD 103. Furthermore, a semiconductor memory device such as flash memory may also be used as a secondary memory device.

A monitor 104a is connected to the graphics processor 104. The graphics processor 104 causes a screen to be displayed on the monitor 104a by following commands from the CPU 101. The monitor 104a may be a display device that uses a liquid crystal display (LCD), for example.

A keyboard 105a and a mouse 105b are connected to the input interface 105. The input interface 105 transmits signals sent from the keyboard 105a and mouse 105b to the CPU 101. Herein, the mouse 105b is one example of a pointing device, and other pointing devices may also be used. Other pointing devices include touchscreens, tablets, touchpads, and trackballs, for example.

The optical drive 106 uses laser ray, etc. to read data recorded onto an optical disc 200. An optical disc 200 is a portable recording medium on which data is recorded so as to be readable by the reflection of light. An optical disc 200 may be a Digital Versatile Disc (DVD), a DVD-RAM, a Compact Disc Read-Only Memory (CD-ROM), or a Compact Disc-Recordable/Rewritable (CD-R/RW), for example.

The communication interface 107 is connected to a network 100. The communication interface 107 sends and receives data to and from other computers or communication equipment via the network 100.

Processing functions of the present embodiment may be realized by a hardware configuration like the above. Functions like the following are provided in a design support apparatus 10 with such a hardware configuration.

Figure 3:
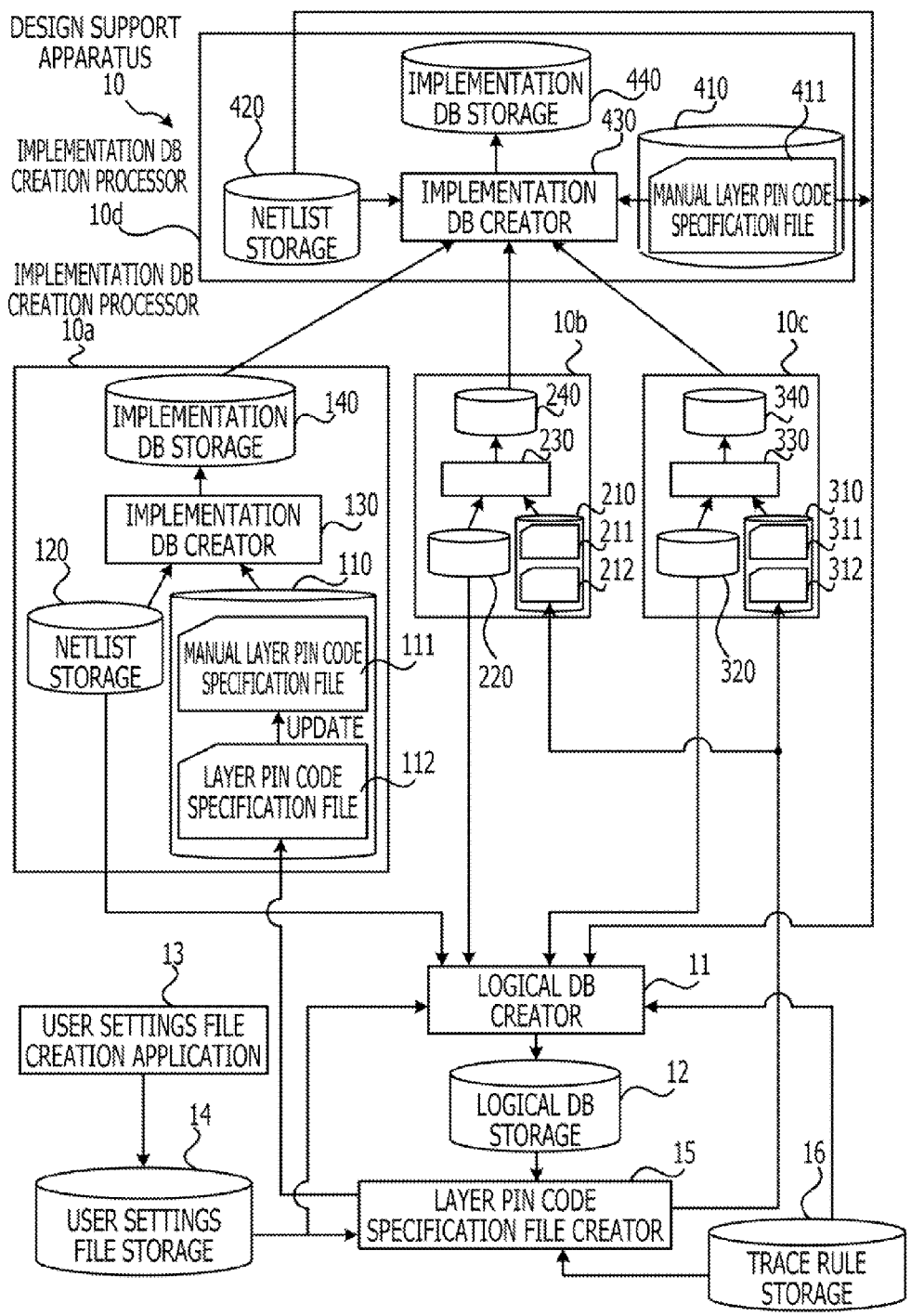
FIG. 3 is a block diagram illustrating functions of a design support apparatus.

FIG. 3 is a block diagram illustrating functions of a design support apparatus. A design support apparatus 10 is an apparatus that assigns net codes to each layer provided in a circuit under design (e.g., LSI).

Figure 4:
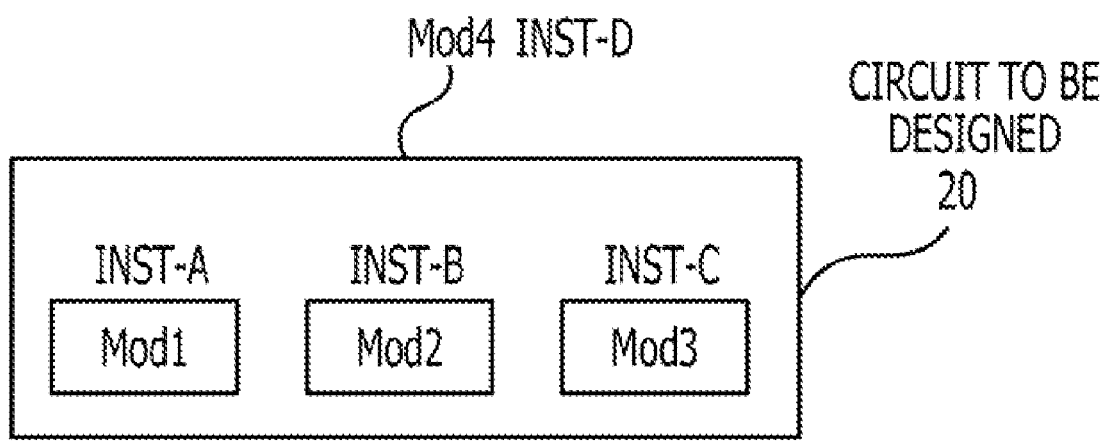
FIG. 4 is a block diagram illustrating an example circuit under design.

FIG. 4 is a block diagram illustrating an example circuit under design. In a circuit under design 20, three instances Inst-A, Inst-B, and Inst-C are placed. The instance Inst-A includes a module Mod1. Inst-B includes a module Mod2. Inst-C includes a module Mod3.

Also, in the circuit under design 20, there is placed an instance Inst-D, which includes a module Mod4 that acts as an upper layer of the modules Mod1, Mod2, and Mod3. Herein, although two layers are illustrated by way of example in the present embodiment, an embodiment is not limited thereto, and the disclosed configuration may also be applied to three or more layers.

Explanation will now refer back to FIG. 3. A design support apparatus 10 includes packaging DB creation processors 10a, 10b, 10c, and 10d.

The packaging DB creation processors 10a, 10b, 10c, and 10d create a packaging database (DB) illustrating packaging information for part of a circuit under design, for each layer provided in the circuit under design 20. The design support apparatus 10 includes packaging DB creation processors 10a, 10b, and 10c which create packaging DBs for the three lower-layer modules Mod1, Mod2, and Mod3 provided in the circuit under design 20, and a packaging DB creation processor 10d which creates a packaging DB for the upper-layer module Mod4.

Hereinafter, a configuration of the packaging DB creation processor 10a will be explained. The packaging DB creation processor 10a includes layer pin code specification file storage 110, netlist storage 120, a packaging DB creator 130, and packaging DB storage 140.

In an initial state before creation of a layer pin code specification file 112, a manual layer pin code specification file 111 created in advance is stored in the layer pin code specification file storage 110.

The manual layer pin code specification file 111 is a file that includes layer pin code information created by a designer for the module Mod1. Herein, a single manual layer pin code specification file 111 is illustrated in FIG. 3, but multiple files may be provided for each kind of design specification-related check discussed later.

Also, when a layer pin code specification file 112 has been created by a layer pin code specification file creator 15 discussed later, the packaging DB creation processor 10a stores the created layer pin code specification file 112 in the layer pin code specification file storage 110 separately from the manual layer pin code specification file 111. This layer pin code specification file 112 is a file that specifies differences with the manual layer pin code specification file 111. The specific contents of the manual layer pin code specification file 111 and the layer pin code specification file 112 will be discussed later.

Furthermore, when a layer pin code specification file 112 has been created by the layer pin code specification file creator 15, the packaging DB creation processor 10a stores the created layer pin code specification file 112 again in the layer pin code specification file storage 110 separately from the layer pin code specification file 112 stored in the layer pin code specification file storage 110.

A netlist summarizing connection information among respective terminals of the module Mod1 is stored in the netlist storage 120. The packaging DB creator 130 creates a packaging DB. More specifically, the packaging DB creator 130 creates net code assignment information in which net codes are assigned to logical nets, on the basis of the netlist stored in the netlist storage 120 and the manual layer pin code specification file 111, or on the basis of the netlist stored in the netlist storage 120 and the layer pin code specification file 112. Herein, net codes may be assigned to logical nets by tracing layer pin code information included in the manual layer pin code specification file 111 and the layer pin code specification file 112.

Additionally, the packaging DB creator 130 creates a packaging DB including the created net code assignment information and the layer pin code information that was used when creating the net code assignment information. The packaging DB storage 140 stores the packaging DB created by the packaging DB creator 130.

The packaging DB creation processors 10b and 10c also include configurations substantially similar to that of the packaging DB creation processor 10a. Herein, description of the packaging DB creation processors 10b and 10c is simplified, and only reference signs corresponding to the packaging DB creation processor 10a are given. For example, the packaging DB creation processor 10b includes layer pin code specification file storage 210 having functions substantially similar to the layer pin code specification file storage 110, netlist storage 220 having functions substantially similar to the netlist storage 120, a packaging DB creator 230 having functions substantially similar to the packaging DB creator 130, and packaging DB storage 240 having functions substantially similar to the packaging DB storage 140.

Next, a configuration of the packaging DB creation processor 10d will be explained. The packaging DB creation processor 10d includes layer pin code specification file storage 410, netlist storage 420, a packaging DB creator 430, and packaging DB storage 440.

The layer pin code specification file storage 410 includes a manual layer pin code specification file 411. The manual layer pin code specification file 411 is a file that includes layer pin code information created by a designer for the module Mod4. Herein, a single manual layer pin code specification file 411 is illustrated in FIG. 3, but multiple files may be provided for each kind of design specification-related check.

The packaging DB creator 430 creates a packaging DB on the basis of packaging DBs respectively stored in the packaging DB storages 140, 240, and 340, a manual layer pin code specification file 411, and a netlist stored in the netlist storage 420. Herein, the packaging DB creation method is substantially similar to the method discussed earlier.

A packaging DB created by the packaging DB creator 430 is stored in the packaging DB storage 440. Additionally, the design support apparatus 10 includes a logical DB creator 11, logical DB storage 12, a user settings file creation application 13, user settings file storage 14, a layer pin code specification file creator 15, and trace rule storage 16.

The logical DB creator 11 creates a logical DB including logical connection information and layer pin code information for the entire circuit, taking the netlists for all layers stored in the netlist storages 120, 220, 320, and 420 and the manual layer pin code specification file 411 as input.

This logical DB may be taken to be a DB that does not have the packaging information saved in the packaging DB, and thus, its data size may be reduced. Furthermore, the logical DB creator 11 includes a memory area (hereinafter referred to as table memory) that stores information temporarily created as part of the creation of a logical DB (net connection information discussed later) and tables (a packaging layer table and layer pin table, etc. discussed later).

A logical DB created by the logical DB creator 11 is stored in the logical DB storage 12. Stored in the user settings file storage 14 is a user settings file in which items are set by a designer, such as instance specifications for which layer pin code information is to be created, black box specifications, and check type specifications, which will be discussed later, respectively.

Respective item specifications in the user settings file may be executed by activating the user settings file creation application 13. A designer may activate the user settings file creation application 13 by operating the keyboard 105a and the mouse 105b, for example.

When the user settings file creation application 13 is activated, a settings screen is displayed on the monitor 104a. A designer is able to set a user settings file by operating the keyboard 105a and the mouse 105b while looking at the displayed settings screen.

The layer pin code specification file creator 15 creates a layer pin code specification file on the basis of a user settings file stored in the user settings file storage 14. Furthermore, the layer pin code specification file creator 15 includes table memory that stores data temporarily created as part of the creation of a layer pin code specification file.

Trace rules are stored in the trace rule storage 16. Herein, an example where the design support apparatus 10 includes a plurality of packaging DB creators corresponding to each layer is given in FIG. 3, but an embodiment is not limited thereto, and it may also be configured such that a single packaging DB creator creates packaging DBs corresponding to respective layers from a netlist for each layer and a manual layer pin code specification file.

Figure 5:
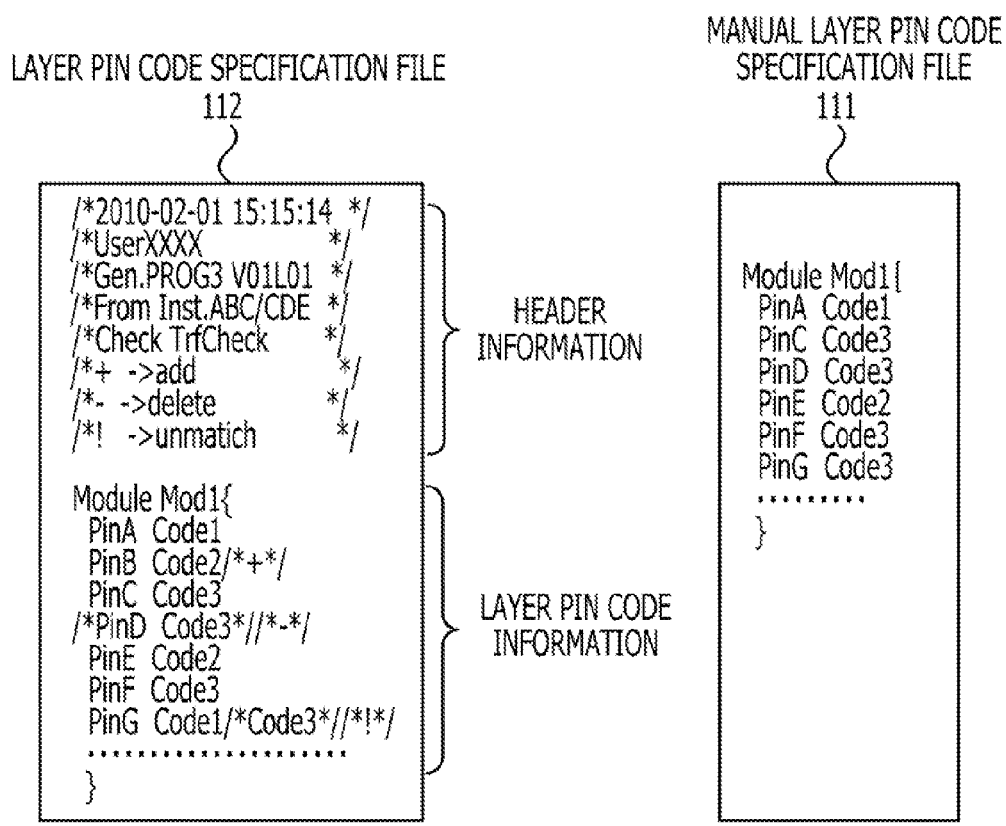
FIG. 5 illustrates a layer pin code specification file and a manual layer pin code specification file.

Next, the contents of a layer pin code specification file 112 and a manual layer pin code specification file 111 will be explained. FIG. 5 illustrates a layer pin code specification file and a manual layer pin code specification file.

In a layer pin code specification file 112 output by the layer pin code specification file creator 15, header information by which a designer manages the file is set at the beginning of the file. The header information is in a comment format enclosed by slash (/) and asterisk (*) characters as discussed earlier, and is disregarded during program execution.

On the first line of the header information in a layer pin code specification file 112, the creation date of the layer pin code specification file 112 is set. On the second line of the header information, the name of the designer who instructed the design support apparatus 10 to create the layer pin code specification file 112 is set. On the third line of the header information, program information for the layer pin code specification file 112 is set. On the fourth line of the header information, the name of an instance forming the basis for the creation of the layer pin code specification file 112 is set. On the fifth line of the header information, a check type of the layer pin code specification file 112 set by conducting a layer pin code specification file output process discussed later is set. With this it becomes possible to automatically determine the check type for which the layer pin code specification file was output. As discussed earlier, when a plurality of check types exist, a plurality of layer pin code specification files 112 corresponding to those check types exist.

On the sixth through eighth lines, information indicating the meaning expressed by symbols is set. There are three types of symbols, meaning add, delete, and mismatch, respectively. In FIG. 5, this is the part denoted by plus (+), minus (−), and exclamation point (!), respectively.

Layer pin code information is set below the header information. Layer pin code information is set for layer pins on a per-layer pin basis. In this layer pin code information, symbols are appended to parts that are inconsistent with a manual layer pin code specification file 111 that forms the basis of the creation of a lower-layer packaging library for the module Mod1. With these appended symbols, it becomes possible for a designer to easily ascertain where inconsistencies have occurred by referring to the marks.

Similarly to the header information, the parts where symbols such as plus (+), minus (−), and exclamation point (!) are enclosed by slash (/) and asterisk (*) characters are in a comment format, and are ignored during program execution.

Figure 6:
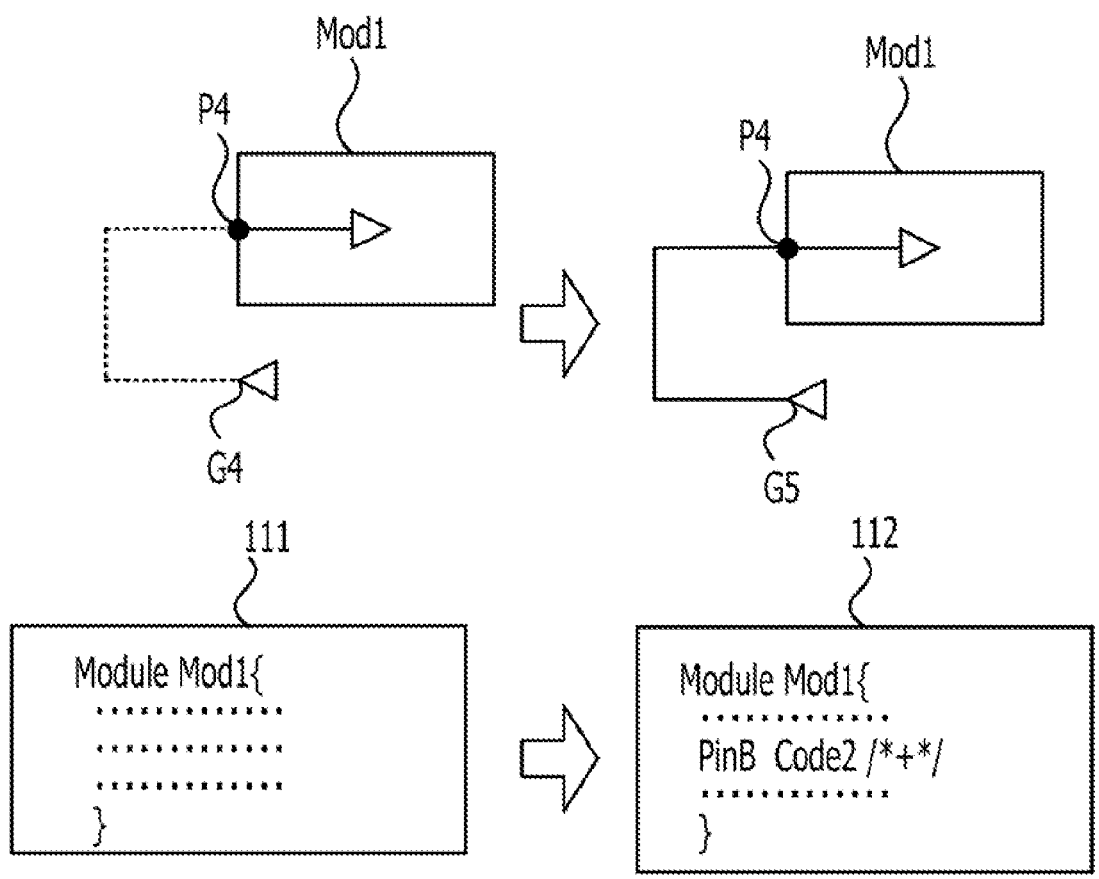
FIG. 6 illustrates layer pin code information.

Next, the layer pin code information "PinB Code2/*+*/" in the layer pin code specification file 112 will be explained. FIG. 6 illustrates layer pin code information.

The manual layer pin code specification file 111 and the layer pin code specification file 112 in FIG. 6 illustrate excerpts of the manual layer pin code specification file 111 and the layer pin code specification file 112 illustrated in FIG. 5. The manual layer pin code specification file 111 indicates that a designer did not set a layer pin code for a pin p4 with the pin name PinB, assuming that it was connected to a gate G4 for which a layer pin code is not set.

However, the results of the layer pin code specification file creator 15 tracing all netlists in the circuit under design 20 indicate that the pin p4 was actually connected to a gate G5 for which a layer pin code "Code2" is set. This state is defined as an "add". In the layer pin code specification file 112, the layer pin code Code2 is set for the pin name PinB of the pin p4. Also, a plus (+) symbol is denoted in comment format "/*+*/", thereby denoting that the layer pin code Code2 has been added for PinB.

Figure 7:
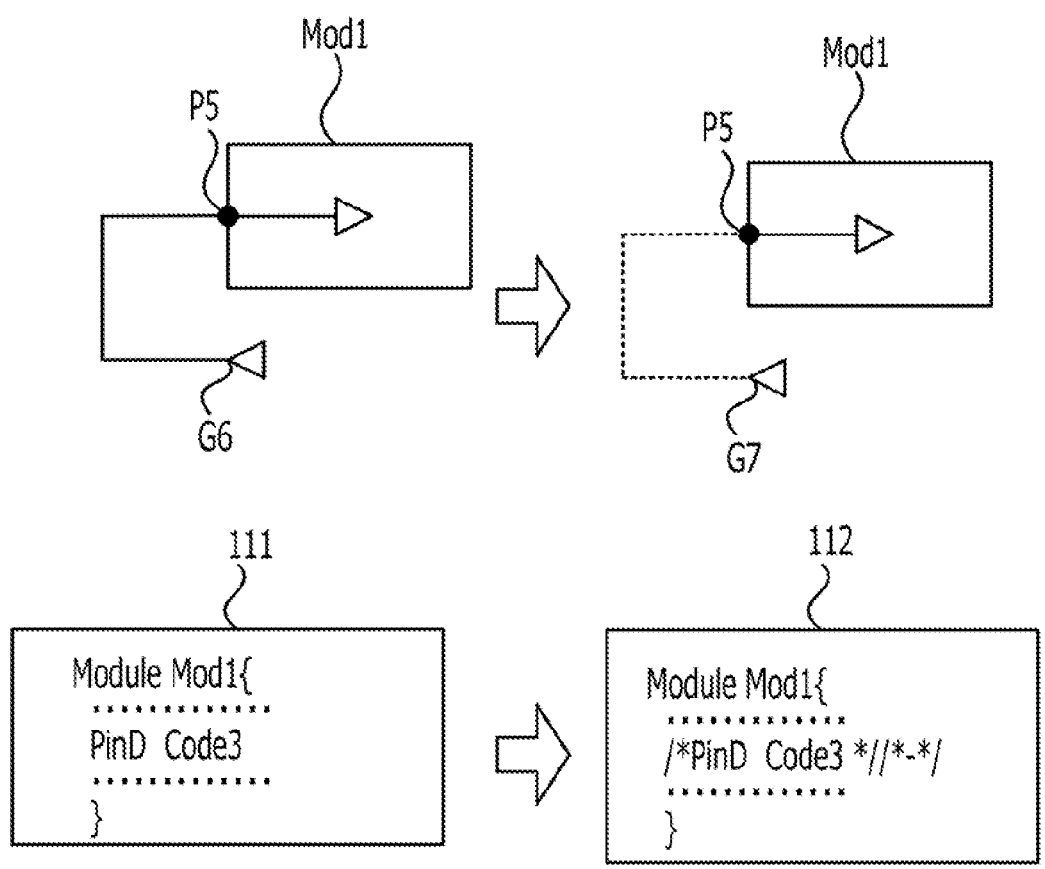
FIG. 7 illustrates layer pin code information.

Next, the layer pin code information "/*PinD Code3*//*−*/" in the layer pin code specification file 112 will be explained. FIG. 7 illustrates layer pin code information.

The manual layer pin code specification file 111 and the layer pin code specification file 112 in FIG. 7 illustrate excerpts of the manual layer pin code specification file 111 and the layer pin code specification file 112 illustrated in FIG. 5. The manual layer pin code specification file 111 indicates that a designer issued pin code settings for a pin p5 with the pin name PinD, assuming that it was connected to a gate G6 for which a pin code "Code3" is set.

However, the results of the layer pin code specification file creator 15 tracing all netlists in the circuit under design 20 indicate that the pin p5 was actually connected to a gate G7 for which a layer pin code is not set. This state is defined as a "delete".

In the layer pin code specification file 112, it is denoted in comment format that the layer pin code Code3 has been deleted for the pin name PinD. Also, a minus (−) symbol is denoted in comment format "/*−*/".

Figure 8:
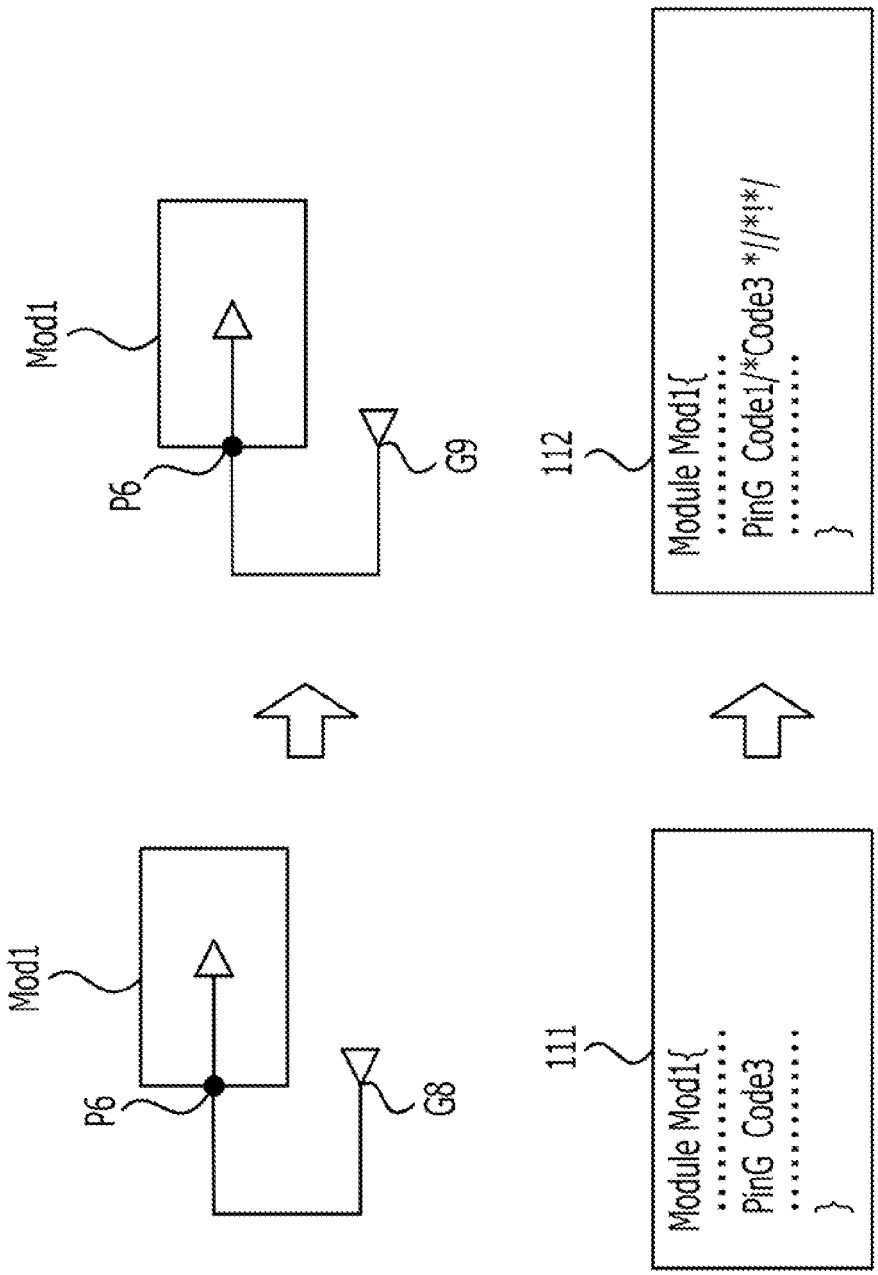
FIG. 8 illustrates layer pin code information.

Next, the layer pin code information "PinG Code1/*Code3*//*!*/" in the layer pin code specification file 112 will be explained. FIG. 8 illustrates layer pin code information.

The manual layer pin code specification file 111 and the layer pin code specification file 112 in FIG. 8 illustrate excerpts of the manual layer pin code specification file 111 and the layer pin code specification file 112 illustrated in FIG. 5. The manual layer pin code specification file 111 indicates that a designer issued pin code settings for a pin p6 with the pin name PinG, assuming that it was connected to a gate G8 for which a pin code "Code3" is set.

However, the results of the layer pin code specification file creator 15 tracing all netlists in the circuit under design 20 indicate that the pin p6 was actually connected to a gate G9 for which a layer pin code "Code1" is set. This state is defined as a "mismatch". In the layer pin code specification file 112, an exclamation point (!) symbol is denoted in comment format. Additionally, in this "mismatch", the pin code "Code3" that was set in the manual layer pin code specification file 111 is also denoted in comment format "/*Code3*/".

Next, the contents of a user settings file will be explained. FIG. 9 illustrates a user settings file. In a user settings file 14a, three parameters generally classified "OutputUnit", "BlackBoxUnit", and "CheckKind" are set.

<Output Unit>

In the "OutputUnit" parameter, layers specified by a designer are set as targets for the creation of layer pin code information by the layer pin code specification file creator 15.

Layers may be specified in this "OutputUnit" on a per-module or per-instance basis. In FIG. 9, "All", "Module EUNIT", "Instance C0/EU", "Instance C1/EU/1,2", "Instance C2/EU/3-5", and "Instance C3/EU/6-" are stated as detailed layer specification parameters.

If a designer specifies "All", the layer pin code specification file creator 15 can be made to create a layer pin code specification file including layer pin code information for all layers. If "Module EUNIT" on the second line is specified, it becomes possible to specify targets for the creation of layer pin code information on a per-module basis. If "Instance" on the third line is specified, it becomes possible to specify targets for the creation of layer pin code information on a per-instance basis. For instances, a designer may specify how many layers below the specified layer are to be set as targets for the creation of layer pin code information.

For example, "Instance C1/EU/1,2" on the fourth line is an example of specifying the layer one layer below and the layer two layers below an instance with the instance name C1. "Instance C2/EU/3-5" on the fifth line is an example of specifying the layers 3-5 layers below an instance with the instance name C2. "Instance C3/EU/6-" on the sixth line is an example of specifying all layers six or more layers below an instance with the instance name C3. A designer specifies "0" when he or she wants to include the instance's own layer.

Also, when a designer has specified redundant parameters in "OutputUnit", the layer pin code specification file creator 15 takes the layers obtained by taking an overall logical sum operation (OR) as targets for the creation of layer pin code information.

Figure 10A:
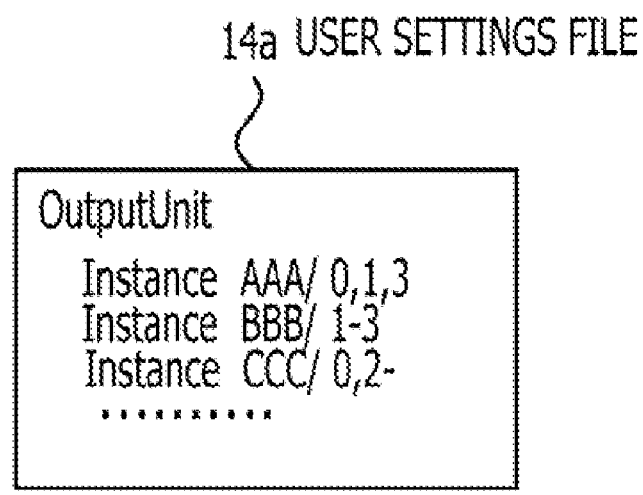
FIG. 10A illustrates "OutputUnit" settings, and FIGS. 10B, 10C and 10D respectively illustrate an instance of a circuit under design designated by the "OutputUnit" settings.

FIG. 10A illustrates "OutputUnit" settings. In the user settings file 14a illustrated in FIG. 10A, all statements other than those for "OutputUnit" are reduced or omitted.

Figure 10B:
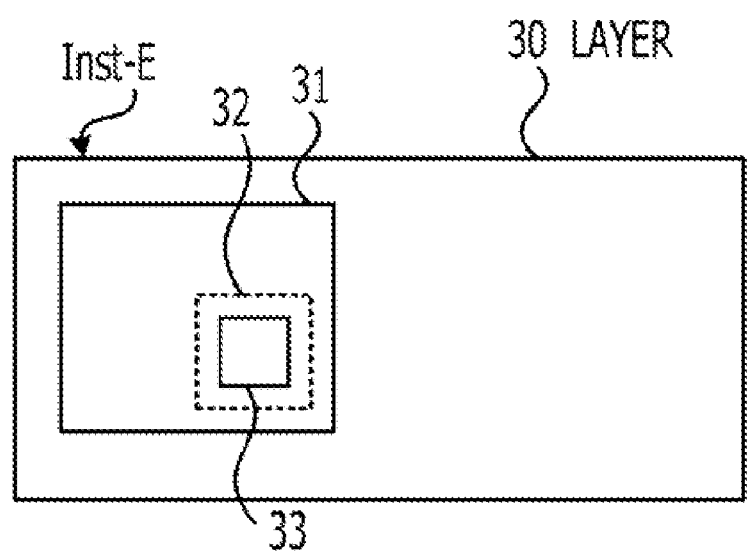
Figure 10C:
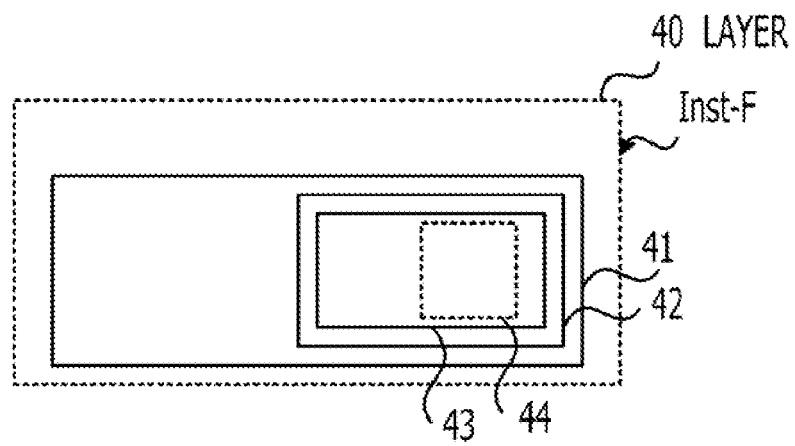
Figure 10D:
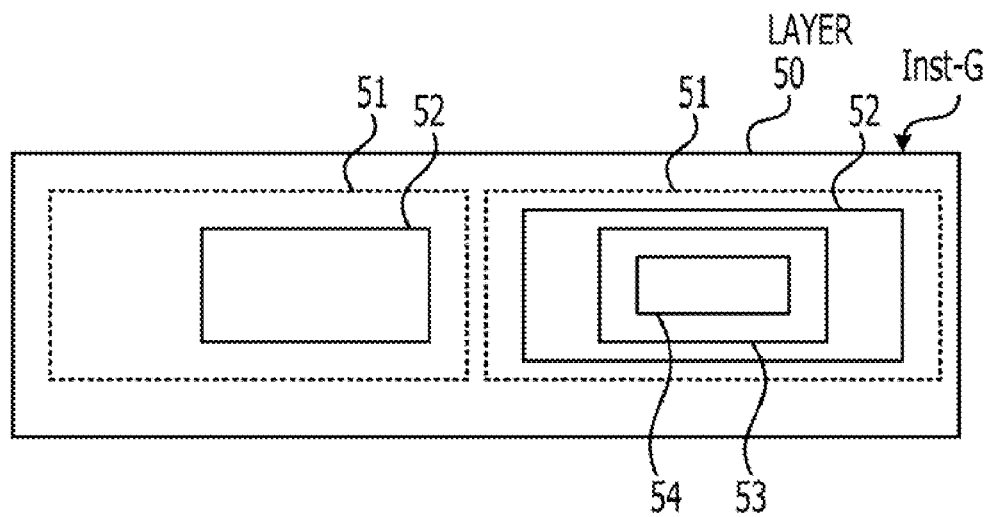

Also, in FIGS. 10B, 10C and 10D, instances of a circuit under design that correspond to specifications in the user settings file 14a are illustrated, respectively. In each instance, layers targeted for the creation of layer pin code information (hereinafter also referred to as "output target layers") are illustrated by solid lines, while layers which are not output targets are illustrated by dotted lines.

According to the statement "Instance AAA/0,1,3" in the user settings file 14a, the layers 30, 31, and 33 of an instance Inst-E with the instance name AAA become output target layers, while the layer 32 is excluded from the targets for the creation of layer pin code information.

Also, according to the statement "Instance BBB/1-3" in the user settings file 14a, the layers 41, 42, and 43 of an instance Inst-F with the instance name BBB become output target layers, while the layers 40 and 44 are excluded from the targets for the creation of layer pin code information.

Also, according to the statement "Instance CCC/0,2-" in the user settings file 14a, the layers 50, 52, 53, and 54 of an instance Inst-G with the instance name CCC become output target layers, while the layer 51 is excluded from the targets for the creation of layer pin code information.

Explanation returns once again to FIG. 9. Next, the BlackBoxUnit parameter corresponding to black box specifications will be explained.

<BlackBoxUnit>

"BlackBoxUnit" specifications are valid when there exist layers which are still being designed. In other words, by treating a layer with an incomplete netlist and its sub-layers as a black box, it is possible to trace net codes without being affected by incomplete logical connection states.

More specifically, when a designer is going to cause the design support apparatus 10 to create packaging DBs while the netlists in the netlist storage are in an incomplete state for any of the packaging DB creation processors 10a, 10b, or 10c, a designer sets layer pin codes in advance in the "BlackBoxUnit" field of the user settings file 14a, the layer pin codes being those that a designer predicts will be set for pins in the incomplete layers once the layers still being designed are completed.

Additionally, when the layer pin code specification file creator 15 acquires data from the logical DB stored in the logical DB storage 12, a flag is set for layers specified in "BlackBoxUnit". The layer pin code specification file creator 15 then sets the layer pin codes set by a designer for the layers set with the flag. Meanwhile, the layer pin code specification file creator 15 also traces net codes from those pins in the packaging DB set with layer pin codes when layer pin codes have been set in the packaging DB of a layer specified as a black box in the user settings file 14a.

According to the above process, the layer pin code specification file creator 15 is able to trace net codes and create a layer pin code specification file without referencing the logical DB storage 12 for logical connection information regarding a specified layer and its sub-layers.

Similarly to "OutputUnit", it is possible to specify layers in "BlackBoxUnit" on a per-module or a per-instance basis. When instance specification is included in module specification, module specification is taken to be valid.

Figure 11A:
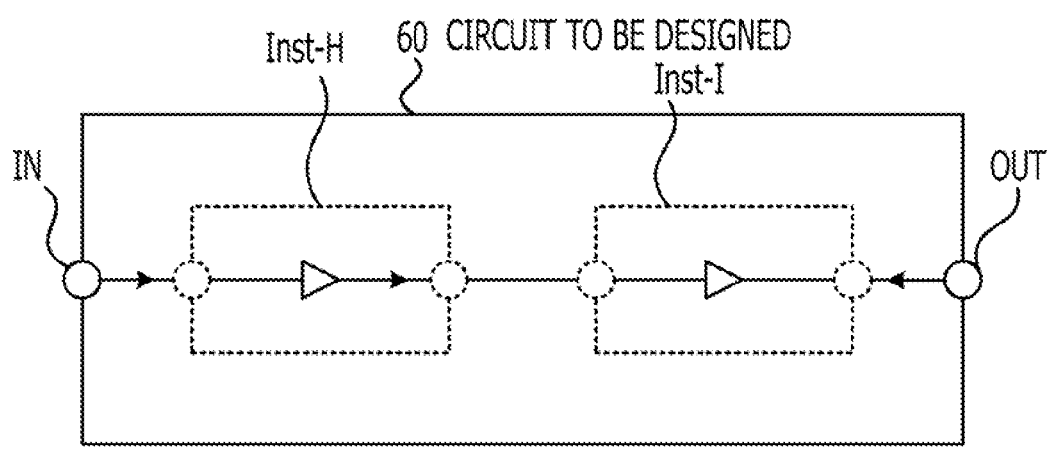
FIGS. 11A and 11B illustrate "BlackBoxUnit" settings.
Figure 11B:
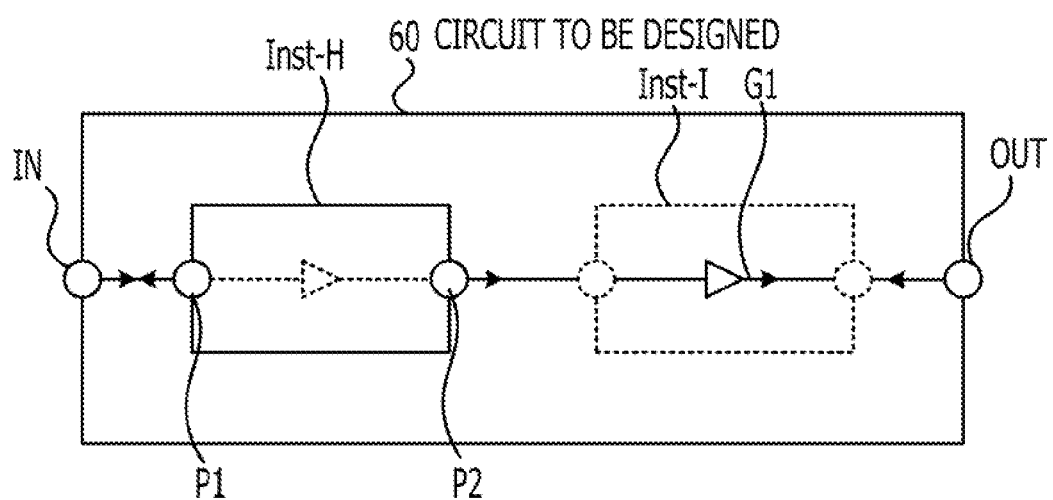

FIGS. 11A and 11B illustrate "BlackBoxUnit" settings. As illustrated in FIG. 11A, when neither an instance Inst-H nor an instance Inst-I are set in "BlackBoxUnit", the layer pin code specification file creator 15 performs net code traces from the gate of the instance Inst-H and the gate of the instance Inst-I to an input terminal In and an output terminal Out of a circuit under design 60.

Meanwhile, as illustrated in FIG. 11B, when only the instance Inst-H from among the instance Inst-H and the instance Inst-I is set in "BlackBoxUnit", the layer pin code specification file creator 15 traces net codes from a gate G1 of the instance Inst-I to an input terminal In and an output terminal Out of a circuit under design 60 and to a pin p1 and a pin p2 of the instance Inst-H.

Explanation returns once again to FIG. 9.

<CheckKind>

In the "CheckKind" parameter, check types specified by a designer as targets for the creation of layer pin code information by the layer pin code specification file creator 15 are set.

The layer pin code specification file creator 15 traces net codes corresponding to specified check types and creates a layer pin code specification file. More specifically, the layer pin code specification file creator 15 traces net codes in the logical DB with trace parameters that differ for each check type, and the layer pin code specification file creator 15 creates a layer pin code specification file for each respective check type.

In FIG. 9, "All", "CrosstalkNoiseCheck", and "TrfCheck" are provided as detailed check type settings in "CheckKind".

If a designer specifies "All", the layer pin code specification file creator 15 can be made to create layer pin code specification files for all check types. If "CrosstalkNoiseCheck" is specified, the layer pin code specification file creator 15 can be made to create a layer pin code specification file used by a designer for crosstalk noise checks between adjacent signal lines. If "TrfCheck" is specified, the layer pin code specification file creator 15 can be made to create a layer pin code specification file used by a designer for waveform rounding checks on an input waveform.

Meanwhile, when a plurality of check type targets are specified, the layer pin code specification file creator 15 creates layer pin code specification files for all specified check types. Hereinafter, a specific example of automatically creating a layer pin code specification file for individual check types will be explained.

Figure 12:
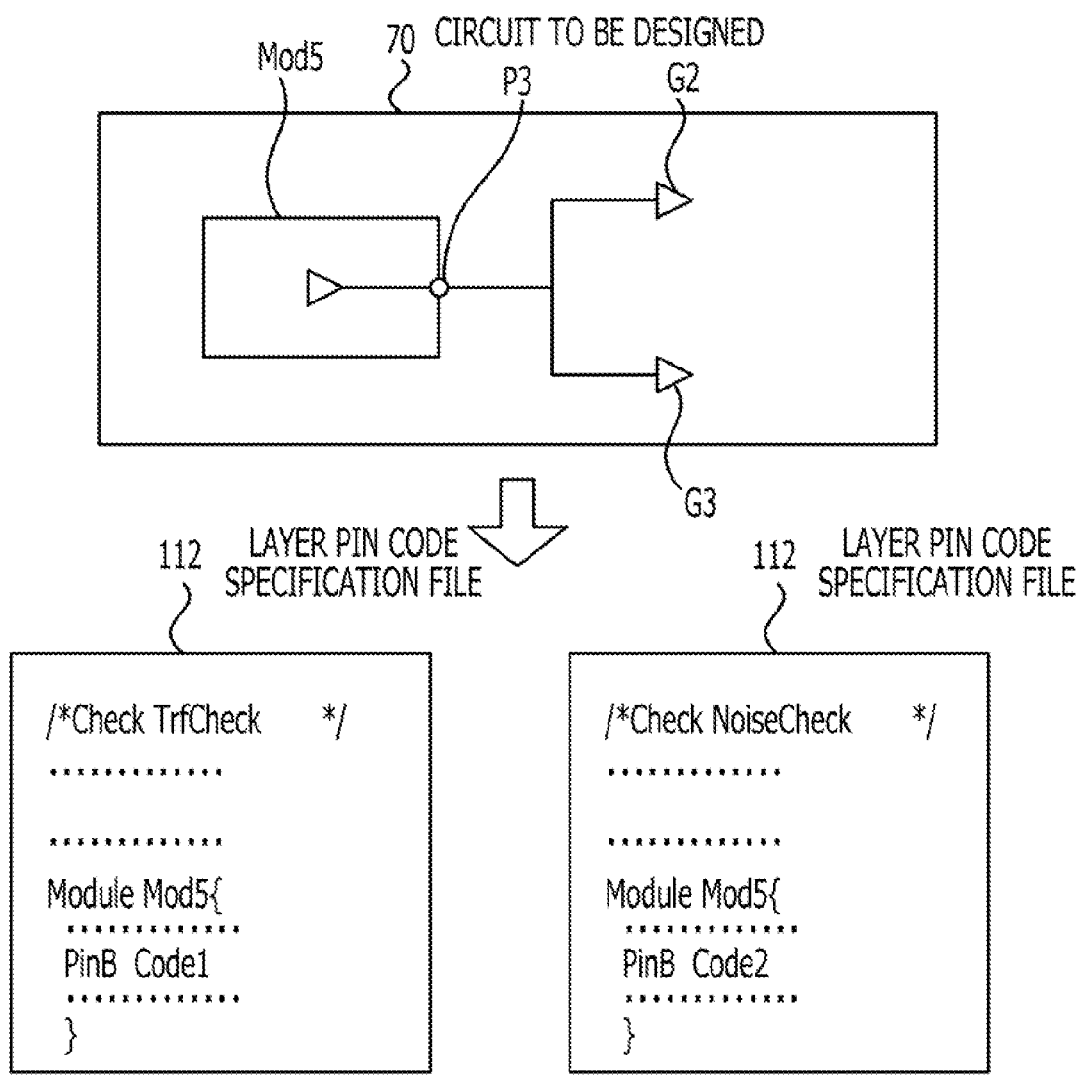
FIG. 12 illustrates "CheckKind" settings.

FIG. 12 illustrates "CheckKind" settings. In FIG. 12, a gate G2 set with a layer pin code Code1 or a gate G3 set with a layer pin code Code2 is connected to a pin p3 with the pin name PinB, which is connected to the output side of a module Mod5 of a circuit under design 70.

For PinB in this state, a designer specifies whether to converge with the pin code Code1 or the pin code Code2. Layer pin code specification files 112 created by the layer pin code specification file creator 15 in accordance with the respective specifications are illustrated at the bottom of FIG. 12.

When "CrosstalkNoiseCheck" is specified in the user settings file 14*a*, the layer pin code specification file creator 15 selects the layer pin code Code1 in accordance with trace rules. As a result of the selection, the layer pin code specification file creator 15 states "PinB Code1" in the layer pin code specification file.

Meanwhile, when "TrfCheck" is specified in the user settings file 14*a*, the layer pin code specification file creator 15 selects the layer pin code Code2 in accordance with trace rules. As a result of the selection, the layer pin code specification file creator 15 states "PinB Code2" in the layer pin code specification file.

Next, a process wherein a designer operates the design support apparatus 10 to create a packaging DB (first overall process) will be explained.

<First Overall Process>

The first overall process is a process for the case where netlists exist in the netlist storages 120, 220, 320, and 420 at the point when a logical DB creation process is initiated. The process for the case where netlists do not exist in some netlist storage from among the netlist storages 120, 220, 320, and 420 is later discussed as a second overall process.

Figure 13:
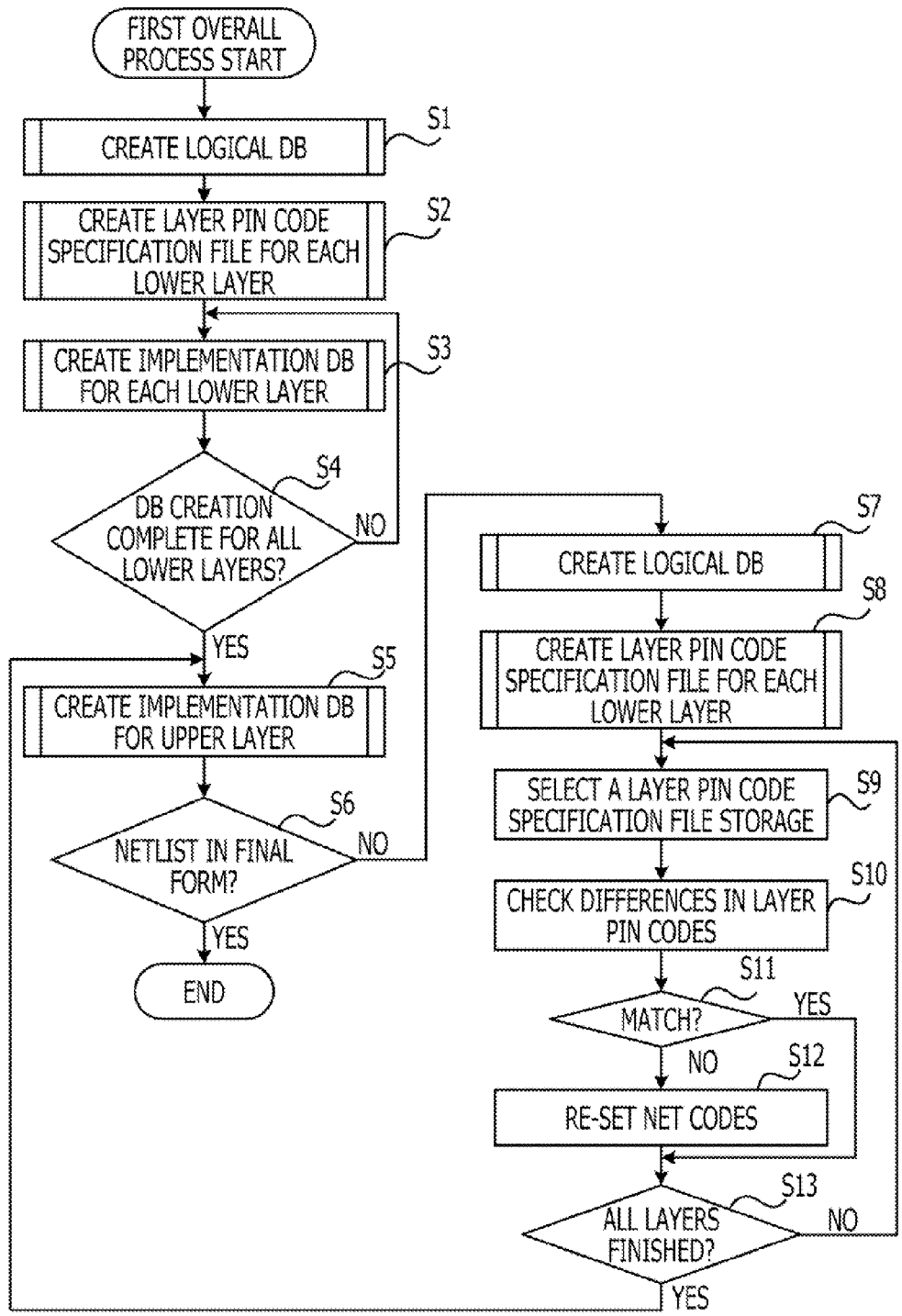
FIG. 13 is a flowchart illustrating a first overall process.

FIG. 13 is a flowchart illustrating a first overall process.

[Operation S1] The logical DB creator 11 creates a logical DB including logical connecting information for the entire circuit of a circuit under design 20, taking netlists stored in the netlist storages 120, 220, 320, and 420 and a manual layer pin code specification file 411 as input. The created logical DB is stored in the logical DB storage 12, and the process proceeds to an operation S2. A method of creating a logical DB will be discussed later.

[Operation S2] The layer pin code specification file creator 15 traces net codes for the logical DB created in operation S1, and creates a layer pin code specification file specifying layer pin codes which are set in each lower layer. A method of creating a layer pin code specification file will be discussed later in detail.

The layer pin code specification file creator 15 discards the logical DB stored in the logical DB storage 12 after the creation of a layer pin code specification file.

[Operation S3] The packaging DB creator 130 creates a lower-layer packaging DB from the layer pin code specification file specifying layer pin codes which are set in lower layers that was created in operation S2 and a netlist stored in the netlist storage 120. The created packaging DB is stored in the packaging DB storage 140. The packaging DB creator 230 likewise creates a packaging DB by conducting a process substantially similar to that of the packaging DB creator 130, and stores the created packaging DB in the packaging DB storage 240. The packaging DB creator 330 likewise creates a packaging DB by conducting a process substantially similar to that of the packaging DB creator 130, and stores the created packaging DB in the packaging DB stored 340. After the storing, the process proceeds to an operation S4. A method of creating a packaging DB will be discussed later.

[Operation S4] A designer determines whether or not packaging DB creation for all lower layers has completed. When packaging DB creation for all lower layers has not completed (operation S4, No), the process proceeds to operation S3. When packaging DB creation for all lower layers has completed (operation S4, Yes), a designer instructs the design support apparatus 10 to create an upper-layer packaging DB. After the instructing, the process proceeds to an operation S5.

[Operation S5] After packaging DB creation for all lower layers is completed, the packaging DB creator 430 creates an upper-layer packaging DB by taking a netlist stored in the netlist storage 420 and a manual layer pin code specification file 411 as input. The packaging DB creator 430 stores the created packaging DB in the packaging DB storage 440, and the process proceeds to an operation S6.

[Operation S6] A designer determines whether or not the netlist stored in the netlist storage 420 is in final form. This determination is made according to whether or not the netlist stored in the netlist storage 420 requires modification according to the packaging DB created in operation S5. When a designer determines that the netlist is in final form (operation S6, Yes), the packaging DB created in operation S5 becomes the basis for a packaging DB included in final design materials taped-out to the semiconductor foundry for the circuit under design 20. Since a target packaging DB has been obtained, the overall process ends.

Meanwhile, when a designer determines that the netlist is not in final form, or in other words, determines that logical modifications (netlist modifications) are still to be made (operation S6, No), a designer modifies the logic of the netlist stored in the netlist storage 420. Then, a designer instructs the design support apparatus 10 to create a logical DB based on the logic-modified netlist. After the instructing, the process proceeds to an operation S7.

[Operation S7] The logical DB creator 11 creates a logical DB that includes logical information for the entire circuit from the logic-modified netlist. The created logical DB is stored in the logical DB storage 12. After the storing, the process proceeds to an operation S8.

[Operation S8] The layer pin code specification file creator 15 reads the logical DB stored in the logical DB storage 12, and then creates a layer pin code specification file for each lower layer from the read logical DB. When creating layer pin code specification files at this point, layer pin code specification files are created in a format that explicitly indicates differences between the layer pin code information stored in the packaging DB storages 140, 240, and 340 that was set before logical modification and the net code trace results. After the setting, the process proceeds to an operation S9.

[Operation S9] A designer selects one from among the layer pin code specification file storages 110, 210, and 310. After the selection, the process proceeds to an operation S10.

[Operation S10] A designer checks the differences between the layer pin code specification file created in operation S8 and stored in the layer pin code specification file storage selected in operation S9, or in other words the layer pin code specification file created after logical modification, and the layer pin code specification file created in operation S2, or in other words the layer pin code specification file created before logical modification. After the checking, the process proceeds to an operation S11.

[Operation S11] From the results of the check in operation S10, a designer determines whether or not the layer pin code specification file matches the layer pin code specification file created before logical modification. When a match is determined (operation S11, Yes), the process proceeds to an operation S13. When a mismatch is determined (operation S11, No), the process proceeds to an operation S12.

[Operation S12] A designer instructs the packaging DB creation processor having the layer pin code specification file storage storing the mismatched layer pin code specification file to re-set net codes. The packaging DB creator of the instructed packaging DB creation processor updates the layer pin code information and net code assignment information assigning net codes to logical nets, on the basis of the layer pin code specification file created after logical modification. After the updating, the process proceeds to an operation S13.

[Operation S13] A designer determines whether or not the processing in operations S10 to S12 has been conducted for all lower layers. When a designer determines that the processing in operations S10 to S12 has not been conducted for all lower layers (operation S13, No), the process proceeds to operation S9, an unselected layer pin code specification file storage is selected, and the processing in operation S10 and thereafter is conducted. When it is determined that the processing in operations S10 to S12 has been conducted for all lower layers (operation S13, Yes), a designer instructs the design support apparatus 10 to create an upper-layer packaging DB. After the instructing, the process proceeds to operation S5.

The above thus explains the first overall process illustrated in FIG. 13. Next, a process whereby the logical DB creator 11 creates a logical DB in operation S1 and operation S7 (logical DB creation process) will be explained using a flowchart.

Figure 14:
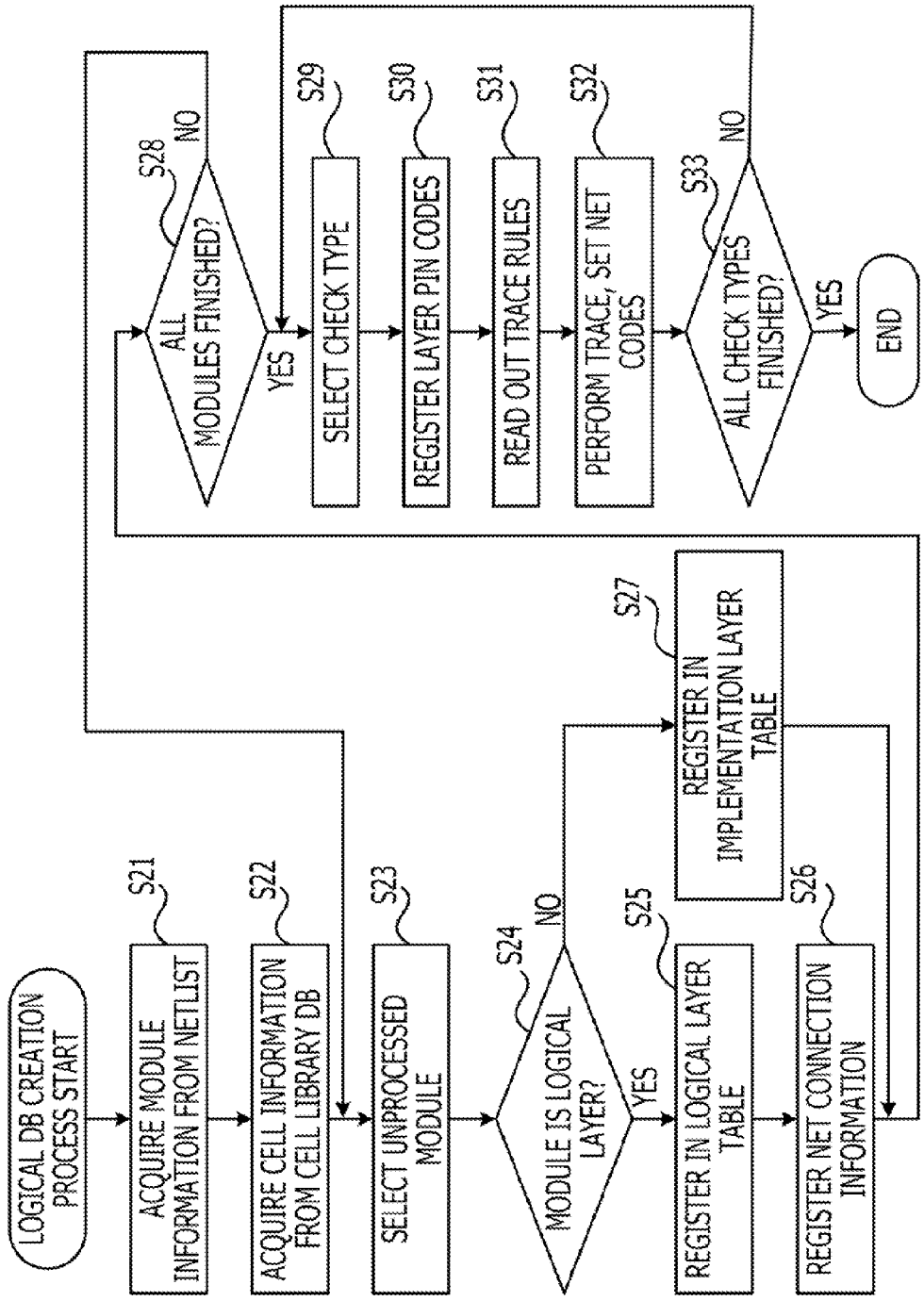
FIG. 14 is a flowchart illustrating a logical DB creation process.

FIG. 14 is a flowchart illustrating a logical DB creation process.

[Operation S21] The logical DB creator 11 reads netlists specified by a designer from the netlist storages 120, 220, 320, and 420, and acquires module information indicating which modules exist in the netlists. After the acquiring, the process proceeds to an operation S22.

[Operation S22] The logical DB creator 11 acquires cell information from a cell library database not illustrated. After the acquiring, the process proceeds to an operation S23.

[Operation S23] From the module information acquired in operation S21, the logical DB creator 11 selects one module for which the processing in operations S24 to S27 has not been executed. After the selecting, the process proceeds to an operation S24.

[Operation S24] The logical DB creator 11 determines whether the module selected in operation S23 is a logical layer or a packaging layer. More specifically, the cell information acquired in operation S22 is referenced, and a module layer for which a cell library does not exist is determined to be a logical layer. A module layer for which a cell library does exist is taken to be a packaging layer. When the selected module is determined to be a logical layer (operation S24, Yes), the process proceeds to an operation S25. When the selected module is determined to not be a logical layer (operation S24, No), the selected module is determined to be a packaging layer and the process proceeds to an operation S27.

[Operation S25] The logical DB creator 11 registers the module selected in operation S23 in a logical layer table. After the registering, the process proceeds to an operation S26.

[Operation S26] The logical DB creator 11 follows logical connections inside the module selected in operation S23 and registers net connection information. After the registering, the process proceeds to an operation S28.

[Operation S27] The logical DB creator 11 registers the module selected in operation S23 in a packaging layer table. After the registering, the process proceeds to an operation S28.

[Operation S28] The logical DB creator 11 determines whether or not the processing in operations S24 to S27 has finished for all modules. This can be determined by appending some kind of identifier to modules for which the processing in operations S24 to S27 has finished, for example. When it is determined that the processing in operations S24 to S27 has finished for all modules (operation S28, Yes), the process proceeds to an operation S29. When it is determined that the processing in operations S24 to S27 has not finished for all modules (operation S28, No), the process proceeds to operation S23, an unselected module is selected, and the processing in operation S24 and thereafter is conducted.

[Operation S29] The logical DB creator 11 references a user settings file 14a and selects one specified check type. After selecting, the process proceeds to an operation S30.

[Operation S30] The logical DB creator 11 reads a manual layer pin code specification file 411 corresponding to the check type selected in operation S29, and registers layer pin code information in a layer pin table. After registering, the process proceeds to an operation S31.

[Operation S31] The logical DB creator 11 reads a trace rule file stored in the trace rule storage 16 and corresponding to the check type selected in operation S29, and stores trace information. After the storing, the process proceeds to an operation S32.

[Operation S32] From the layer pin code information and the trace information, the logical DB creator 11 traces the logical connection information and sets net codes corresponding to the check type selected in operation S29 in a net table. After the setting, the process proceeds to an operation S33.

[Operation S33] The logical DB creator 11 determines whether or not the processing in S30 to S32 has been conducted for all check types specified in the user settings file 14a. When it is determined that the processing in S30 to S32 has not been conducted for all check types (operation S33, No), the process proceeds to operation S29, an unselected check type is selected, and the processing in operation S30 and thereafter continues. In so doing, net codes for each check type are set in a net table. When it is determined that the processing in S30 to S32 has been conducted for all check types (operation S33, Yes), the logical DB creation process ends.

According to this logical DB creation process, a logical DB that respectively includes a logical layer table, net connection information, a packaging layer table, layer pin code information, trace information, and a net table is created.

The above thus explains a logical DB creation process. Next, details of a process conducted by the layer pin code specification file creator 15 illustrated in operation S2 and operation S8 in FIG. 13 (layer pin code specification file creation process) will be explained.

Figure 15:
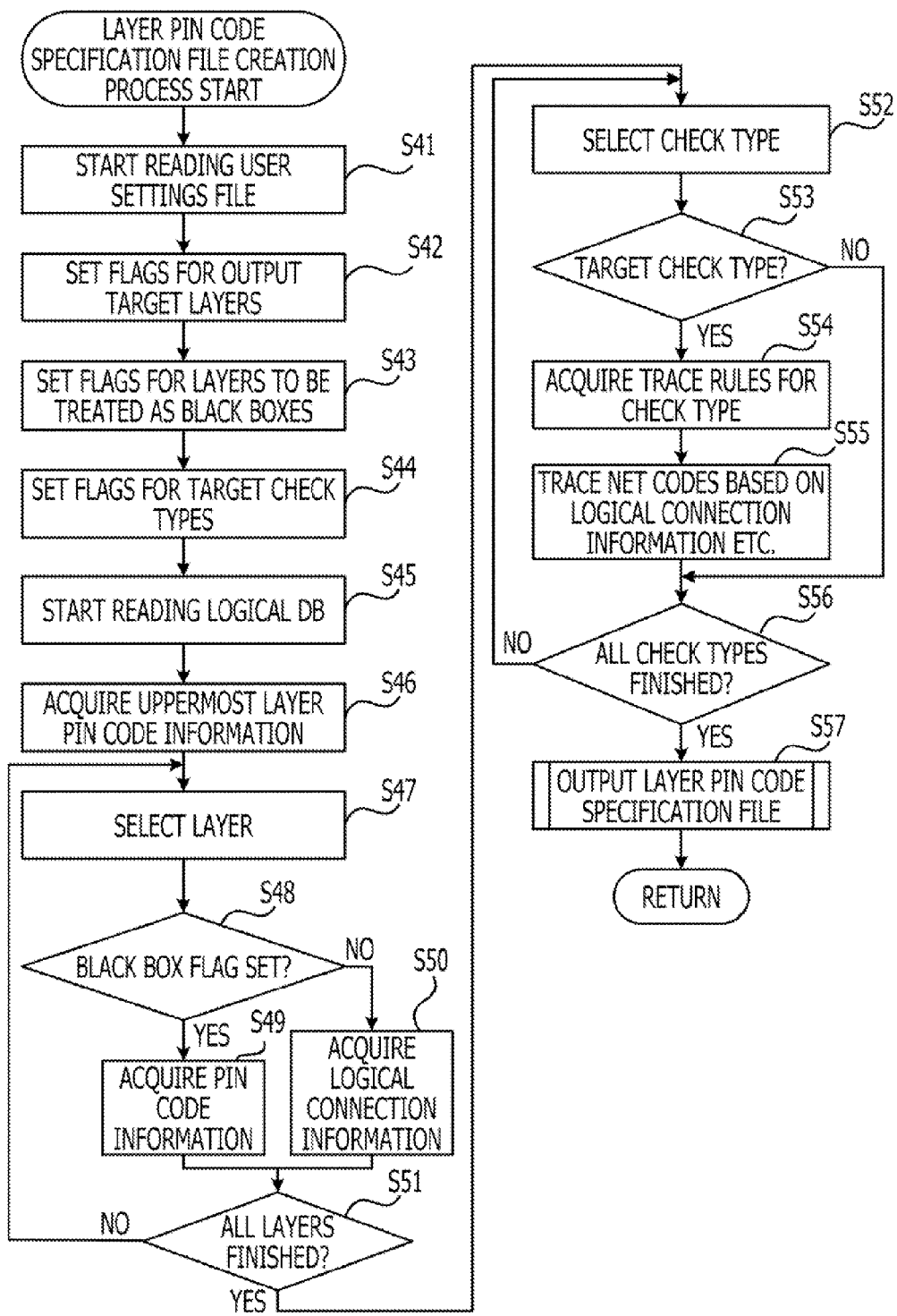
FIG. 15 is a flowchart illustrating a layer pin code specification file creation process.

FIG. 15 is a flowchart illustrating a layer pin code specification file creation process.

[Operation S41] The layer pin code specification file creator 15 reads a user settings file 14a. The process proceeds to an operation S42.

[Operation S42] The layer pin code specification file creator 15 references "OutputUnit" statements in the user settings file 14a that was read and sets output target flags for the set layers. Then, the layer pin code specification file creator 15 stores output target flag information identifying the layers set with output target flags in table memory. After the storing, the process proceeds to an operation S43.

[Operation S43] The layer pin code specification file creator 15 references "BlackBoxUnit" statements in the user settings file 14a that was read and sets black box flags for the layer to be treated as black boxes due to being incomplete, for example, when tracing net codes. Then, the layer pin code specification file creator 15 stores black box flag information identifying the layers set with black box flags in table memory. After the storing, the process proceeds to an operation S44.

[Operation S44] The layer pin code specification file creator 15 references "CheckKind" statements in the user settings file 14a that was read and sets check type flags by which net codes are traced and layer pin code specification files are output for a target check type. Then, the layer pin code specification file creator 15 stores check type flag information, which identifies check type flags, in table memory. After the storing, the process proceeds to an operation S45.

[Operation S45] The layer pin code specification file creator 15 reads a logical DB from the logical DB storage 12. The read information is stored in table memory.

[Operation S46] The layer pin code specification file creator 15 acquires layer pin code information for the uppermost layer included in the logical DB that was read in operation S45. After the acquiring, the process proceeds to an operation S47.

[Operation S47] The layer pin code specification file creator 15 selects a lower layer. After the selecting, the process proceeds to an operation S48.

[Operation S48] The layer pin code specification file creator 15 references black box flag information stored in table memory, and determines if the layer that was selected in operation S47 is specified as a layer to be treated as a black box. The determination is made according to whether or not a black box flag is set. When a black box flag is set (operation S48, Yes), the layer pin code specification file creator 15 determines that the layer which was selected in operation S47 is specified as a layer to be treated as a black box, and the process proceeds to an operation S49. When a black box flag is not set (operation S48, No), the layer pin code specification file creator 15 determines that the layer which was selected in operation S47 is not specified as a layer to be treated as a black box, and the process proceeds to an operation S50.

[Operation S49] For a layer to be treated as a black box, the layer pin code specification file creator 15 acquires layer pin code information set in the packaging DB corresponding to the layer which was selected in operation S47 and stores the acquired information into table memory without referencing logical connection information for that layer or its sub-layers. After the storing, the process proceeds to an operation S51.

[Operation S50] For a layer not to be treated as a black box, the layer pin code specification file creator 15 references logical connection information included in the logical DB for the layer which was selected in operation S47 and its sub-layers, and stores the referenced logical connection information into table memory. After the storing, the process proceeds to an operation S51.

[Operation S51] The layer pin code specification file creator 15 determines whether or not the processing in operations S48 to S50 has finished for all layers. When an unprocessed layer still exists (operation S51, No), the process proceeds to operation S47 and the processing in operations S48 to S50 continues for an unselected layer. When processing has finished for all layers (operation S51, Yes), the process proceeds to an operation S52.

The reading of data from a logical DB is completed in the processing up to operation S51.

[Operation S52] The layer pin code specification file creator 15 traces net codes for individual check types. More specifically, a check type is selected. After the tracing, the process proceeds to an operation S53.

[Operation S53] The layer pin code specification file creator 15 references check type flag information stored in table memory. Then, the layer pin code specification file creator 15 determines whether or not the check type which was selected in operation S52 is specified as a check type to be processed in the user settings file 14a. The determination is made according to whether or not a check type flag exists. When a check type flag is set (operation S53, Yes), the layer pin code specification file creator 15 determines that the check type which was selected in operation S52 is a check type to be processed according to a user settings file, and the process proceeds to an operation S54. When a check type flag is not set (operation S53, No), the layer pin code specification file creator 15 determines that the check type which was selected in operation S52 is not specified as a check type to be processed according to a user settings file, and the process proceeds to an operation S56.

[Operation S54] The layer pin code specification file creator 15 acquires logic circuit trace rules corresponding to the check type to be processed. The acquired trace rules are read into table memory. After the reading, the process proceeds to an operation S55.

[Operation S55] When the reading of trace rules into table memory is complete, the layer pin code specification file creator 15 traces net codes with respect to a logic circuit according to the trace rules and on the basis of the logical connection information that was read in operation S50, the uppermost layer pin code information that was read in operation S46, and the black box layer pin code information that was read in operation S49. Net code information obtained by tracing is read into table memory. After the obtaining, the process proceeds to an operation S56.

[Operation S56] The layer pin code specification file creator 15 determines whether or not the processing in operations S53 to S55 has finished for all check types. When unprocessed check types exist (operation S56, No), the process proceeds to operation S52, and the processing in operations S53 to S55 is continued for an unselected check type. When processing has finished for all check types (operation S56, Yes), the process proceeds to an operation S57.

Trace processing is finished in the processing up to operation S56.

[Operation S57] The layer pin code specification file creator 15 outputs a layer pin code specification file on the basis of the net code information that was read into table memory in operation S55. After the reading, the process illustrated in FIG. 15 ends.

Figure 16:
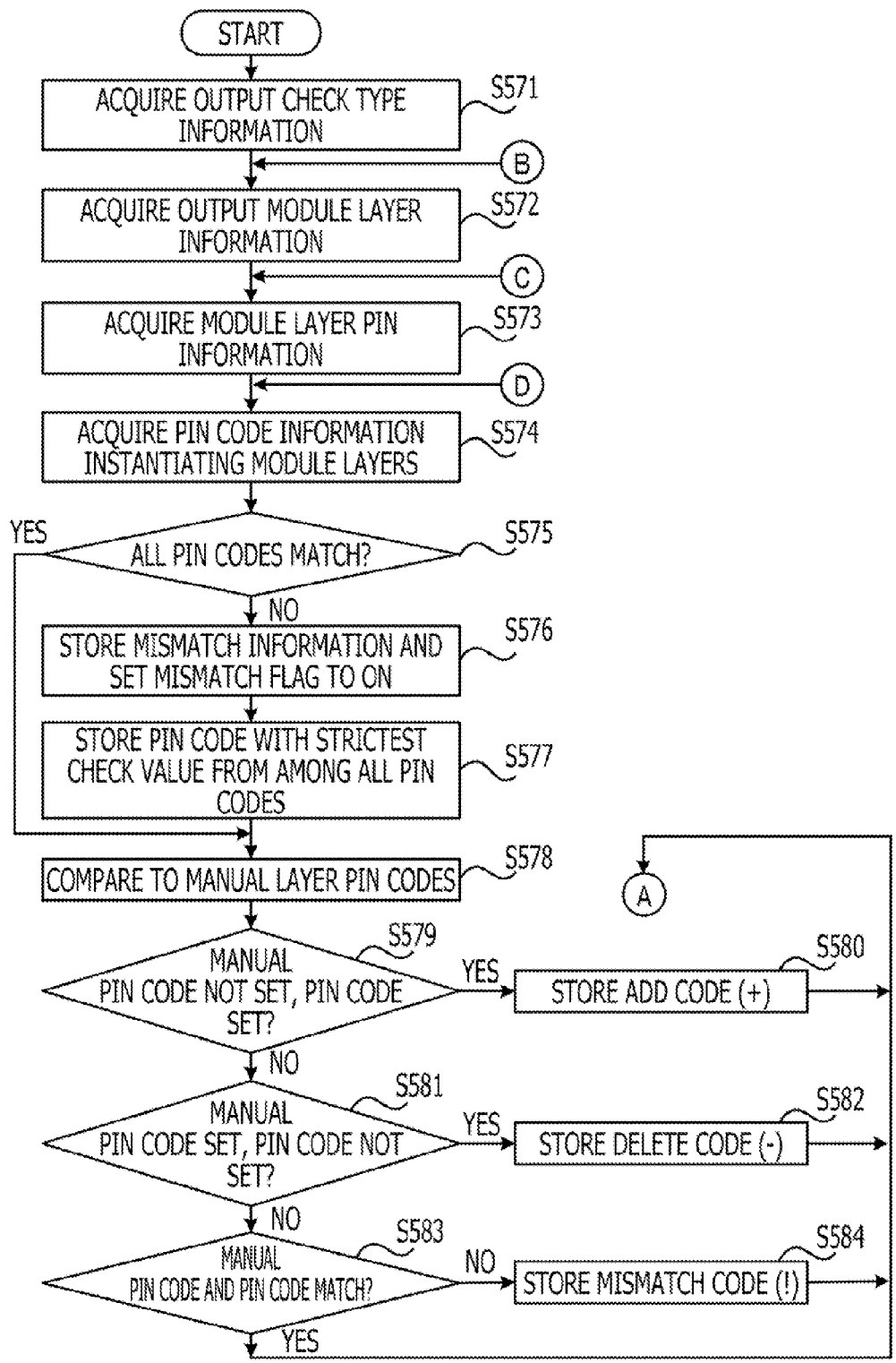
FIG. 16 is a flowchart illustrating a layer pin code specification file output process.
Figure 17:
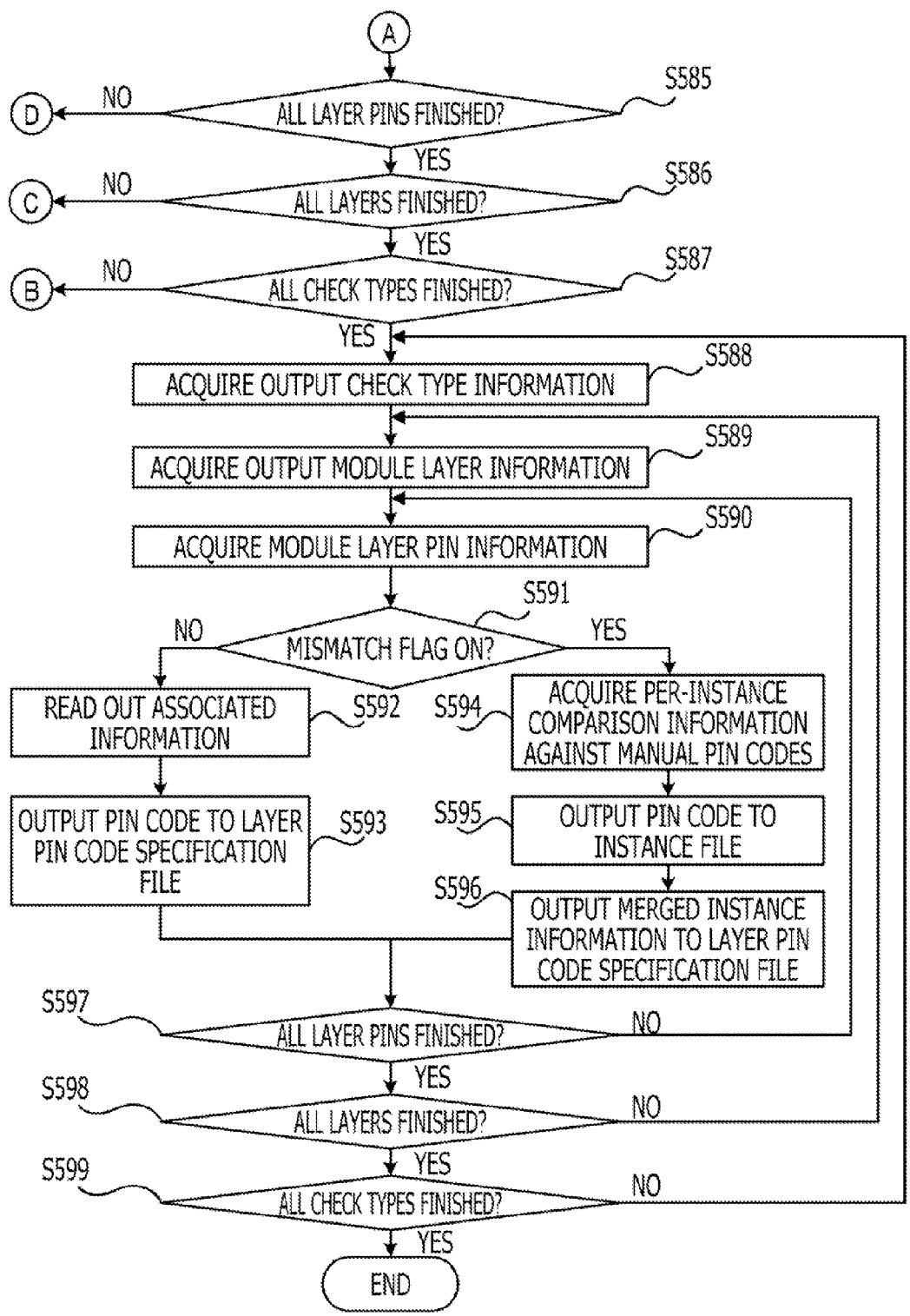
FIG. 17 is a flowchart illustrating a layer pin code specification file output process.

Next, the processing in operation S57 of FIG. 15 (a layer pin code specification file output process) will be explained in detail. FIGS. 16 and 17 are flowcharts illustrating a layer pin code specification file output process.

[Operation S571] The layer pin code specification file creator 15 identifies a check type on the basis of output check type flag information stored in table memory. After the identifying, the process proceeds to an operation S572.

[Operation S572] The layer pin code specification file creator 15 identifies output target module layers from the output target flags that were set in operation S42 of FIG. 15. After the identifying, the process proceeds to an operation S573.

[Operation S573] The layer pin code specification file creator 15 acquires layer pin information for output target module layers on the basis of a logical layer table or packaging layer table included in the logical DB. After the acquiring, the process proceeds to an operation S574.

[Operation S574] The layer pin code specification file creator 15 acquires the layer pin code information of instances instantiating a module given by the module layer pin information from a packaging DB. After the acquiring, the process proceeds to an operation S575.

[Operation S575] The layer pin code specification file creator 15 determines whether or not the layer pin code information for all instances match. When it is determined that the layer pin code information for all instances do match (operation S575, Yes), the process proceeds to an operation S578. When it is determined that the layer pin code information for all instances does not match (operation S575, No), the process proceeds to an operation S576.

[Operation S576] Mismatch information for the layer pin information and mismatch information for the module layers of each instance is stored. Also, a mismatch flag is set to ON. After the setting of the flag, the process proceeds to an operation S577.

[Operation S577] The layer pin code specification file creator 15 selects the layer pin code with the strictest check value restriction from among the layer pin codes for each instance by taking the logical product (AND) of the check values for the layer pin codes for each instance. The selected layer pin code is stored in table memory. After the storing, the process proceeds to an operation S578.

[Operation S578] The layer pin code specification file creator 15 compares the layer pin code to the manual layer pin code for each instance. After the comparing, the process proceeds to an operation S579.

[Operation S579] From the comparison results from operation S578, the layer pin code specification file creator 15 determines whether or not the current state is such that manual layer pin codes are not set and traced layer pin codes are set on the basis of the trace results from operation S55 in FIG. 15. If in a state where manual layer pin codes are not set and traced layer pin codes are set (operation S579, Yes), the process proceeds to an operation S580. If not in a state where manual layer pin codes are not set and traced layer pin codes are set (operation S579, No), the process proceeds to an operation S581.

[Operation S580] The layer pin code specification file creator 15 stores association information into table memory of the layer pin code specification file creator 15, the association information associating an add code, i.e. a plus (+), with the module layer pin information that was acquired in operation S573. After the storing, the process proceeds to an operation S585.

[Operation S581] From the comparison results from operation S578, the layer pin code specification file creator 15 determines whether or not the current state is such that manual layer pin codes are set and traced layer pin codes are not set. If in a state where manual layer pin codes are set and traced layer pin codes are not set (operation S581, Yes), the process proceeds to an operation S582. If not in a state where manual layer pin codes are set and traced layer pin codes are not set (operation S581, No), the process proceeds to an operation S583.

[Operation S582] The layer pin code specification file creator 15 stores association information into table memory of the layer pin code specification file creator 15, the association information associating a delete code, i.e. a minus (−), with the module layer pin information that was acquired in operation S573. After the writing, the process proceeds to an operation S585.

[Operation S583] From the comparison results from operation S578, the layer pin code specification file creator 15 determines whether or not the manual layer pin codes and the traced layer pin codes match. If the manual layer pin codes and the traced layer pin codes do match (operation S583, Yes), the process proceeds to an operation S585. If the manual layer pin codes and the traced layer pin codes do not match (operation S583, No), the process proceeds to an operation S584.

[Operation S584] The layer pin code specification file creator 15 stores association information into table memory of the layer pin code specification file creator 15, the association information associating a mismatch code, i.e., an exclamation point (!), with the module layer pin information that was acquired in operation S573. After the storing, the process proceeds to operation S585.

[Operation S585] The layer pin code specification file creator 15 determines whether or not the processing in operations S574 to S584 has been completely executed for all layer pins. When it is determined that processing has been completely executed for all layer pins (operation S585, Yes), the process proceeds to an operation S586. When it is determined that processing has not been completely executed for all layer pins (operation S585, No), the process proceeds to operation S574, unprocessed pin code information is acquired, and the processing in operation S575 and thereafter is executed.

[Operation S586] The layer pin code specification file creator 15 determines whether or not the processing in operations S574 to S584 has been completely executed for all module layers. When it is determined that processing has been completely executed for all module layers (operation S586, Yes), the process proceeds to an operation S587. When it is determined that processing has not been completely executed for all module layers (operation S586, No), the process proceeds to operation S573, an unprocessed module layer is acquired, and the processing in operation S574 and thereafter is executed.

[Operation S587] The layer pin code specification file creator 15 determines whether or not the processing in operations S574 to S584 has been completely executed for all check types. When it is determined that processing has been completed for all check types (operation S587, Yes), the process proceeds to an operation S588. When it is determined that processing has not been completely executed for all check types (operation S587, No), the process proceeds to operation S572, an unprocessed check type is acquired, and the processing in operation S573 and thereafter is executed.

[Operation S588] The layer pin code specification file creator 15 acquires output check type information with a method similar to S571. After the acquiring, the process proceeds to an operation S589.

[Operation S589] The layer pin code specification file creator 15 acquires output module layer information with a method similar to S572, and the process proceeds to an operation S590.

[Operation S590] The layer pin code specification file creator 15 acquires layer pin information for output module layers with a method similar to S573. After the acquiring, the process proceeds to an operation S591.

[Operation S591] The layer pin code specification file creator 15 determines whether or not a mismatch flag checked and stored in operation S576 for layer pin information instantiating a module layer is ON. When the mismatch flag is not ON (operation S591, No), the process proceeds to an operation S592. When the mismatch flag is ON (operation S591, Yes), the process proceeds to an operation S594.

[Operation S592] The mismatch flag not being ON means that the trace results for layer pin information instantiating a module are all the same. The layer pin code specification file creator 15 reads the associated information that was introduced into table memory in operations S580, S582, and S584. After the reading, the process proceeds to an operation S593.

[Operation S593] The layer pin code specification file creator 15 outputs layer pin code specification files for module layers appended with the read associated information. One layer pin code specification file is output for each module layer to respective layer pin code specification file storage, and the process proceeds to an operation S597.

[Operation S594] The mismatch flag being ON means that at least part of the trace results for layer pin information instantiating a module do not match. The layer pin code specification file creator 15 acquires information that was stored in operations S580, S582, and S584 for the layer pins of the instances. After the acquiring, the process proceeds to an operation S595.

[Operation S595] The layer pin code specification file creator 15 outputs the information acquired in operation S594 on a per-instance basis as a layer module pin code specification file for each instance, and the process proceeds to an operation S596.

[Operation S596] The layer pin code specification file creator 15 takes merged information stored in operations S577, S580, S582, and S584 for the layer pins of instances, and outputs the merged information on a per-module layer basis as a layer pin code specification file, which is output to respective layer pin code specification file storage. After the outputting, the process proceeds to an operation S597.

[Operation S597] The layer pin code specification file creator 15 determines whether or not the processing in operations S591 to S596 has been executed for all layer pins. When it is determined that processing has been executed for all layer pins (operation S597, Yes), the process proceeds to an operation S598. When it is determined that processing has not been executed for all layer pin groups (operation S597, No), the process proceeds to operation S590, unprocessed pin code information is acquired, and the processing in operation S591 and thereafter is executed.

[Operation S598] The layer pin code specification file creator 15 determines whether or not the processing in operations S591 to S596 has been completely executed for all module layers. When it is determined that processing has been completely executed for all module layers (operation S598, Yes), the process proceeds to an operation S599. When it is determined that processing has not been completely executed for all module layers (operation S598, No), the process proceeds to operation S589, an unprocessed module layer is acquired, and the processing in operation S590 and thereafter is executed.

[Operation S599] The layer pin code specification file creator 15 determines whether or not the processing in operations S591 to S596 has been completely executed for all check types. When it is determined that processing has been completely executed for all check types (operation S599, Yes), the layer pin code specification file output process ends. When it is determined that processing has not been completely executed for all check types (operation S599, No), the process proceeds to operation S588, an unprocessed check type is acquired, and the processing in operation S589 and thereafter is executed.

According to the processing in operations S597 to S599, by performing operations S591 to S596 on all layer pin groups, module layer groups, and check type groups, a layer pin code specification file is output for all output target check types, output target module layers, and instance layers.

The above thus explains a layer pin code specification file output process. Next, a process of creating a packaging DB by the packaging DB creators 130, 230, 330, and 430 in operation S3 and operation S5 (packaging DB creation process) will be explained using a flowchart.

Herein, since the processing of each packaging DB creator by the respective packaging DB creation processors 10a, 10b, 10c, and 10d are equivalent, the processing the packaging DB creator 130 is given as an example. FIG. 18 is a flowchart illustrating a packaging DB creation process.

[Operation S61] The packaging DB creator 130 reads a netlist specified by a designer from the netlist storage 120, and acquires module information, and the process proceeds to an operation S62.

[Operation S62] The packaging DB creator 130 acquires cell information from a cell library database (not illustrated), and the process proceeds to an operation S63.

[Operation S63] The packaging DB creator 130 selects a module for which the processing in operations S64 to S67 has not been executed, and the process proceeds to an operation S64.

[Operation S64] The packaging DB creator 130 determines whether the module that was selected in operation S63 is a logical layer or a packaging layer. At this point, a module layer for which a cell library does not exist is determined to be a logical layer, while a module layer for which a cell library does exist is determined to be a packaging layer. When the selected module is determined to be a logical layer (operation S64, Yes), the process proceeds to an operation S65. When it is determined that the selected module is not a logical layer (operation S64, No), the selected module is determined to be a packaging layer, and the process proceeds to an operation S67.

[Operation S65] The packaging DB creator 130 registers the module that was selected in operation S63 in a logical layer table, and the process proceeds to an operation S66.

[Operation S66] The packaging DB creator 130 follows logical connections inside the module selected in operation S63 and registers net connection information, and the process proceeds to an operation S68.

[Operation S67] The packaging DB creator 130 registers the module that was selected in operation S63 in a packaging layer table, and the process proceeds to operation S68.

[Operation S68] The packaging DB creator 130 determines whether or not the processing in operations S64 to S67 has finished for all modules. This can be determined by appending some kind of identifier to modules for which the processing in operations S64 to S67 has finished, for example. When it is determined that the processing in operations S64 to S67 has finished for all modules (operation S68, Yes), the process proceeds to an operation S69. When it is determined that the processing in operations S64 to S67 has not finished for all modules (operation S68, No), the process proceeds to operation S63.

[Operation S69] The packaging DB creator 130 creates a packaging information table setting placements, wiring, and other packaging information for conducting packaging work. After the creating, the process proceeds to an operation S70.

[Operation S70] The packaging DB creator 130 references the user settings file 14a and selects a specified check type, and the process proceeds to an operation S71.

[Operation S71] The packaging DB creator 130 reads a manual layer pin code specification file 111 corresponding to the check type that was selected in operation S70, and then registers layer pin code information in a layer pin table. After the reading, the process proceeds to an operation S72.

[Operation S72] The packaging DB creator 130 reads a trace rule file stored in the trace rule storage 16 and corresponding to the check type that was selected in operation S70, and stores trace information. After the storing, the process proceeds to an operation S73.

[Operation S73] The packaging DB creator 130 traces logical connection information from layer pin code information and trace information, and sets net codes corresponding to the check type that was selected in operation S70 in a net table. The net codes specified at this point are used by a designer during package design, and the process proceeds to an operation S74.

[Operation S74] The packaging DB creator 130 determines whether or not the processing in operations S71 to S73 has been conducted for all check types specified in the user settings file 14a. When the processing in operations S71 to S73 has not been conducted for all check types (operation S74, No), the process proceeds to an operation S70, an unselected check type is selected, and the processing in operation S71 and thereafter is continued. In so doing, net codes are set in a net table for each check type. When it is determined that the processing in operations S71 to S73 has been conducted for all check types (operation S74, Yes), the packaging DB creation process ends.

Next, a specific example of operation S577 will be explained. As discussed earlier, regarding the output of layer pin code specification files, the layer pin code specification file creator 15 creates layer pin code specification files on a per-instance or a per-module basis according to a specification in a user settings file 14a.

Layer pin code specification files are created on a per-module as long as the layer pin code information matches among modules. When the layer pin code information does not match among modules, layer pin code specification files are created on a per-instance basis.

When the same module is instantiated, the created file will exhibit the same results for each instance if the method of using the module in a circuit under design is the same for each instance. However, when the method of using the module in a circuit under design differs among instances, the pin codes for the same pins specified in the created files will differ among instances. The case where the pin codes for the same pins specified in the created files differ among instances will lead to a longer design period when doing packaging work using individual layer pin code specification files for each instance in the lower layers.

Thus, when the same module is instantiated such that the pin codes for the same pins specified in the created files respectively differ, the layer pin code specification file creator 15 merges the created files to re-create files on a per-module basis. In the case of merging created files, the basis for selecting a pin code when the same pin exists is taken to be selecting the pin among the pins with different pin codes having the strictest restriction value for that check type. Thus, it becomes possible to satisfy the constraints on all instances even when using the merged per-module files in lower layers, thereby keeping the design period from becoming longer.

Figure 19:
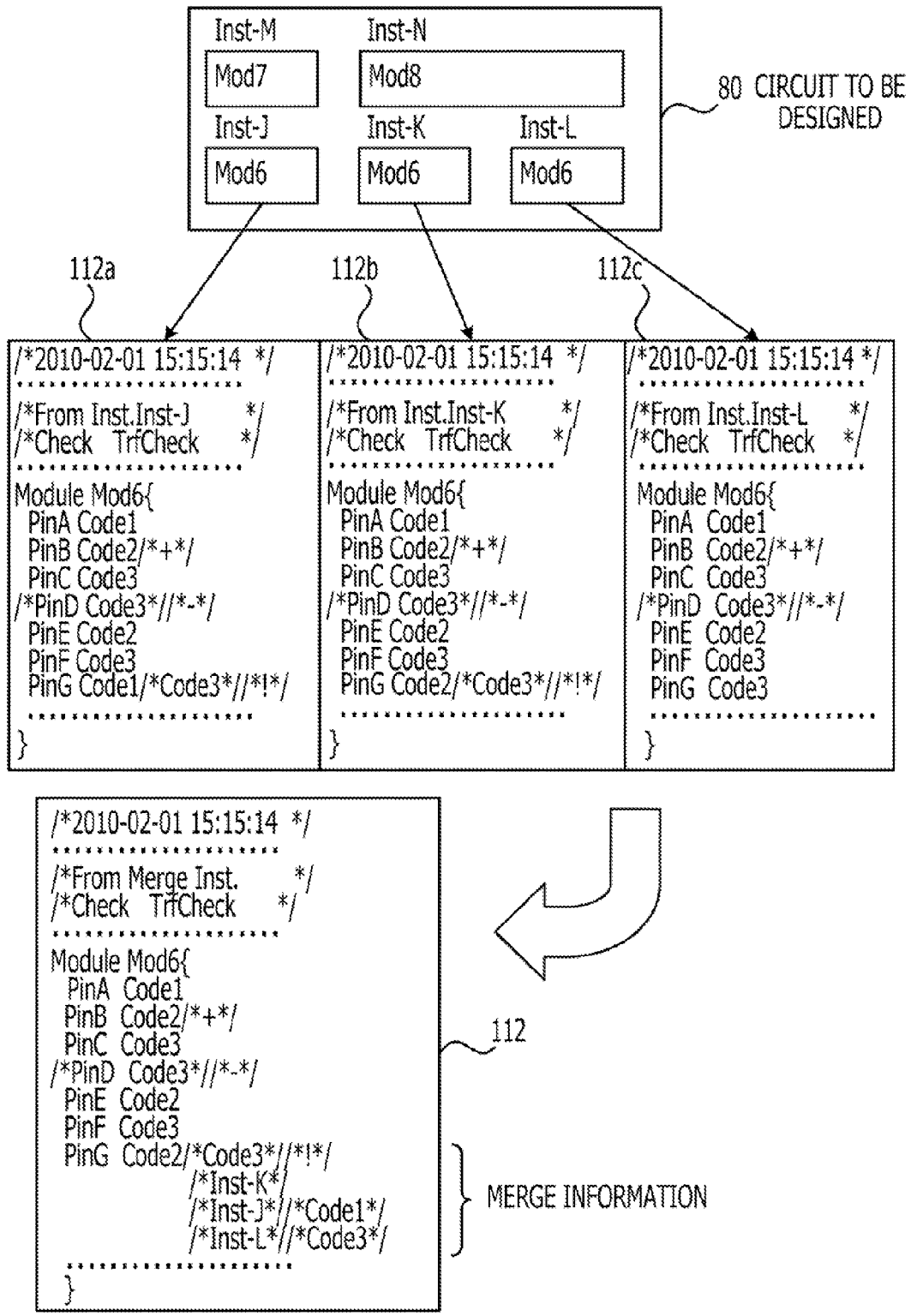
FIG. 19 illustrates a specific example for the case where respectively different pin codes are set in lower layers.

FIG. 19 illustrates a specific example for the case where respectively different pin codes are set in lower layers. Five instances Inst-J to Inst-N are placed on a circuit under design 80. Three of the instances from the instance Inst-J to Inst-L are instantiations of the same module Mod6.

Assume that the three layer pin code specification files 112a, 112b, and 112c are obtained as a result of the layer pin code specification file creator 15 tracing all circuits included in the circuit under design 80. The layer pin code specification files 112a, 112b, and 112c illustrate a result wherein different pin codes are assigned to the same pin specified in the created files. As illustrated in FIG. 19, the layer pin codes specified for PinG are Code1 in the instance Inst-J, Cod2 in the instance Inst-K, and Code3 in the instance Inst-L.

In such a state, a file merging process is carried out as discussed earlier in operation S577 of FIG. 16. The merging method involves selecting the code with the strictest check type restriction value during file creation, and setting that code as the layer pin code of PinG.

Also, identification information is output for the merged file, which indicates that the file is a merged file. Also, merge information indicating specifically how the file was merged is output.

In FIG. 19, the following merge information (1) to (4) is stated for PinG set in a layer pin code specification file 112 output which is ultimately output to the layer pin code specification file storage 110. (1) Code2 was selected for PinG. (2) Code2 is the layer pin code that was set in the instance Inst-K. (3) The differing instances are the instances Inst-J and Inst-L. (4) The differing layer pin code information is Inst-J Code 1 and Inst-L Code3.

Additionally, "/*From Merge Inst.*/" which indicates that a merge process has been conducted is set as a comment in the header information. If the three layer pin code specification files 112a, 112b, and 112c for the instances Inst-J to Inst-L are applied to respective lower-layer modules and the design periods to process so as to satisfy all constraints are compared, it becomes possible to create a design that satisfies the constraints of all instances Inst-J to Inst-L in a very short period by applying the merged layer pin code specification file 112 to the lower-layer modules Mod6 and conducting packaging design.

As described above, according to a design support apparatus 10, as a result of a layer pin code specification file creator 15 creating a layer pin code specification file, the accuracy of layer pin code specification is improved compared to the case of a designer manually appending layer pin codes. Thus, mistaken assignment of net codes can be suppressed. Consequently, the accuracy of various checks using net codes can be improved, and the reliability of a circuit under design can be improved.

Also, attempting to shorten the design period is possible as a result of the layer pin code specification file creator 15 creating a layer pin code specification file. Also, it is configured such that when layer pin codes are mismatched, a layer pin code specification file 112 selecting the code with the strictest restriction value from among all layer pin codes is output. For this reason, over-checks and under-checks of the specifications for a circuit under design can be suppressed.

Next, a second overall process will be explained.

<Second Overall Process>

As discussed earlier, the second overall process is a process for the case where netlists for some layers exist in the respective netlist storage at the time when the process is initiated.

FIG. 20 is a flowchart illustrating a second overall process. In FIG. 20 herein, an "a" is appended to operation numbers corresponding to the first overall process.

[Operation S3a] A designer instructs the packaging DB creators for layers with completed netlists to create packaging DBs, and the process proceeds to an operation S3b.

[Operation S3b] A designer determines whether or not packaging DB creation has completed for all lower layers. When packaging DB creation has not completed for all lower layers (operation S3b, No), the process proceeds to operation S3a. When packaging DB creation has completed for all lower layers (operation S3b, Yes), the process proceeds to an operation S1a.

[Operation S1a] The logical DB creator 11 proceeds to packaging work from the layers with completed netlists, and creates a logical DB including logical information for the entire circuit at the stage where netlists are completed for all layers. The logical DB creator 11 stores the created logical DB in the logical DB storage 12, and the process proceeds to an operation S2a.

[Operation S2a] The layer pin code specification file creator 15 creates a layer pin code specification file for each lower layer from the logical DB stored in the logical DB storage 12. Herein, when creating a layer pin code specification file, the layer pin code specification file creator 15 creates a layer pin code specification file in a format that specifies differences between the layer pin code information set in a manual layer pin code specification file stored in the packaging DB storage and the net code trace results, and the process proceeds to an operation ST1.

[Operation ST1] From among the packaging DB creators 130, 230, and 330, a designer selects a packaging DB for which operations ST2 to ST4 have not been executed. After the selecting, the process proceeds to an operation ST2.

[Operation ST2] A designer checks, on a per-layer basis, the differences between the layer pin code specification files created in operation S2a and a layer pin code specification file that was created manually, and the process proceeds to an operation ST3.

[Operation ST3] From the results of the check in operation ST2, a designer determines whether or not the respective layer pin codes in the layer pin code specification files created in operation S2a match the layer pin codes of the layer pin code specification file created before logical modification. When the respective layer pin codes in the layer pin code specification files that were created in operation S2a all match the layer pin codes in the layer pin code specification file created before logical modification (operation ST3, Yes), the process proceeds to an operation S4a. When a mismatched layer pin code exists (operation ST3, No), the process proceeds to an operation ST4.

[Operation ST4] The packaging DB creator that was selected in operation ST1 updates (replaces) the mismatched layer pin code of the layer pin code specification file inside the corresponding packaging DB with the contents of the layer pin code of the layer pin code specification file created in operation S2a. Also, net code assignment information inside the corresponding packaging DB is updated, and the process proceeds to operation S4a.

[Operation S4a] A designer determines whether or not the processing in operations ST2 to ST4 has finished for the packaging DB creators for all lower-layer packaging DBs. When it is determined that the processing in operation ST2 to ST4 has finished for all lower-layer packaging DBs (operation S4a, Yes), a designer instructs the design support apparatus 10 to create an upper-layer packaging DB, and the process proceeds to an operation S5a. When it is determined that there still exists a lower-layer packaging DB creator for which the processing in operations ST2 to ST4 has not finished (operation S4a, No), a designer selects a packaging DB creator for which operations S2 to S4 have not been executed, and then instructs the design support apparatus 10 to process the selected packaging DB creator, and the process proceeds to operation ST1.

[Operation S5a] The packaging DB creator 430 creates an upper-layer packaging DB, taking a netlist stored in the netlist storage 420 and a manual layer pin code specification file 411 as input. The packaging DB creator 430 stores the created packaging DB in the packaging DB storage 440.

[Operation S6a] A designer determines whether or not the netlist stored in the netlist storage 420 is in final form. When a designer determines that the netlist is in final form (operation S6a, Yes), the packaging DB created in operation S5a becomes the basis for a packaging DB ultimately used to tape-out (the final stage of the design cycle for integrated circuits at which the artwork for the photo-mask of a circuit is sent for manufacture) the circuit under design 20. Since a target packaging DB has been obtained, the overall process ends.

Meanwhile, when a designer determines that the netlist is not in final form (operation S6a, No), a designer modifies the logic of the netlist stored in the netlist storage 420. Then, a designer instructs the design support apparatus 10 to create a logical DB based on the logic-modified netlist, and the process proceeds to an operation S7a.

[Operation S7a] The logical DB creator 11 creates a logical DB that includes logical information for the entire circuit from the logic-modified netlist. The created logical DB is stored in the logical DB storage 12, and the process proceeds to an operation S8a.

[Operation S8a] The layer pin code specification file creator 15 reads the logical DB stored in the logical DB storage 12, and then creates a layer pin code specification file for each lower layer from the read logical DB. When creating layer pin code specification files at this point, the layer pin code information stored in the packaging DB storage that was set before logical modification is compared to net code trace results, and a layer pin code specification file is created in a format by which the differences therebetween can be understood. After the creating, the process proceeds to an operation S9a.

[Operation S9a] A designer selects one from among the layer pin code specification file storage 110, 210, and 310. After the selection, the process proceeds to an operation S10a.

[Operation S10a] A designer checks the differences between the layer pin code specification file created in operation S8a, or in other words the layer pin code specification file created after logical modification, and the layer pin code specification file created in operation S2a, or in other words the layer pin code specification file created before logical modification. After the creating, the process proceeds to an operation S11a.

[Operation S11a] From the results of the check in operation S10a, a designer determines whether or not the layer pin code specification file matches the layer pin code specification file created before logical modification. When a match is determined (operation S11a, Yes), the process proceeds to an operation S13a. When a mismatch is determined (operation S11a, No), the process proceeds to an operation S12a.

[Operation S12a] A designer instructs the packaging DB creation processor having the layer pin code specification file storage 110 storing the mismatched layer pin code specification file to re-set net codes. The packaging DB creator of the instructed packaging DB creation processor updates the layer pin code information and net code assignment information assigning net codes to logical nets, on the basis of the layer pin code specification file created after logical modification, and the process proceeds to an operation S13a.

[Operation S13a] A designer determines whether or not the processing in operations S10a to S12a has been conducted for all lower layers. When a designer determines that the processing in operations S10a to S12a has not been conducted for all lower layers (operation S13a, No), the process proceeds to operation S9a, an unselected layer pin code specification file storage is selected, and the processing in operation S10a and thereafter is conducted. When it is determined that the processing in operations S10a to S12a has been conducted for all lower layers (operation S13a, Yes), a designer instructs the design support apparatus 10 to create an upper-layer packaging DB, and the process proceeds to operation S5a.

The above thus explains the second overall process illustrated in FIG. 20. According to the second overall process, the packaging DB creator 430 is able to create a packaging DB even if not all netlists are completed.

It may also be configured such that the processing conducted by the design support apparatus 10 is distributed over a plurality of apparatus. For example, it may be configured such that one apparatus conducts the logical DB creation process to create a logical DB, while other apparatus use that logical DB to create a layer pin code specification file.

The foregoing thus explains a design support apparatus, a design support method, and a design support program of the present invention on the basis of illustrated embodiments, but the present invention is not limited thereto, and the configuration of respective components may be replaced by arbitrary configurations having similar functions. Also, other arbitrary configurations and operations may be added to the present invention.

The present invention may also be a combination of two or more arbitrary configurations (features) from among the respective embodiments discussed above. Meanwhile, the above processing functions may also be realized by a computer. In this case, a program stating processing operations for the functions that should be included in a design support apparatus 1 or design support apparatus 10 is provided. By executing such a program with a computer, the above processing functions are realized on a computer. The program stating the processing operations may be recorded onto a computer-readable recording medium. The computer-readable recording medium may be a magnetic storage apparatus, an optical disc, a magneto-optic recording medium, semiconductor memory, etc. The magnetic storage apparatus may be a hard disk drive (HDD), a flexible disk (FD), magnetic tape, etc. The optical disc may be a DVD, DVD-RAM, CD-ROM/RW, etc. The magneto-optical recording medium may be a magneto-optical (MO) disc, etc.

In the case of distributing the program, a DVD, CD-ROM, or other portable recording medium having the program recorded thereon may be sold, for example. Also, the program may be stored on a storage apparatus in a server computer and the program may be transferred to other computers from the server computer via a network.

A computer that executes the program may store a program recorded on a portable recording medium or a program transferred from a server computer in its own storage apparatus, for example. The computer may then read out the program from its own storage apparatus and execute processing in accordance with the program. However, the computer may also read out the program directly from a portable recording medium and execute processing in accordance with the program. Also, the computer may successively execute processing in accordance with a received program as the program is transferred from a server computer connected to the computer via a network.

Also, at least part of the above processing functions may be realized by an electronic circuit such as a digital signal processor (DSP), an application-specific integrated circuit (ASIC), or a programmable logic device (PLD).

All examples and conditional language recited herein are intended for pedagogical objects to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

What is claimed is:

1. A design support apparatus for supporting designing of a circuit, the design support apparatus comprising:
   a database storage that stores a first database including respective logical connection information for a first-layer circuit and a second-layer circuit laid lower than the first-layer circuit, both provided in the circuit;
   a file generator that traces logical connection type identification information identifying types of logical connections from the first-layer circuit to the second-layer circuit based on the logical connection information included in the first database, and generates a layer terminal information file that includes layer terminal code information associating layer terminals in the second-layer circuit with layer terminal codes having trace information regarding the logical connection type identification information; and
   a database generator that generates a second database based on the generated layer terminal information file for the second-layer circuit that includes placement information for a plurality of cells included in the circuit and wiring information for wiring among the plurality of cells.

2. The design support apparatus according to claim 1, wherein
   the first database includes pre-generated layer terminal code information, and
   the file generator generates a layer terminal information file that includes identification information identifying differences between the layer terminal code information obtained by the trace of the logical connection type identification information and the pre-generated layer terminal code information when generating the layer terminal information file.

3. The design support apparatus according to claim 1, wherein
   the database generator generates a third database for the first-layer circuit that includes placement information for the plurality of cells included in the circuit and wiring information for wiring among the plurality of cells based on the second database and the logical connection information for the first-layer circuit.

4. The design support apparatus according to claim 1, wherein when the first-layer circuit includes a plurality of instances corresponding to a same module, the file generator detects differences in layer terminal codes for individual instances in the plurality of instances with respect to the corresponding same module, and the file generator generates the layer terminal information file by selecting the layer terminal code set with the strictest design parameters as for the differing layer terminal codes when differing layer terminal codes are set in individual instances in the plurality of instances.

5. The design support apparatus according to claim 4, wherein the file generator generates the layer terminal information file by attaching information to the layer terminal information file which indicates that the layer terminal code with the strictest design parameters was selected for the differing layer terminal codes.

6. The design support apparatus according to claim 1, wherein when the second-layer circuit is specified as a black box that includes only layer terminals and layer terminal codes, the file generator generates the second database by setting layer terminal codes prepared in advance for the layer terminals of the second-layer circuit specified as the black box.

7. The design support apparatus according to claim 1, wherein the file generator generates the layer terminal information file as for layers indicated by set layer specification information.

8. The design support apparatus according to claim 1, wherein the file generator generates the layer terminal information file as for check types indicated by set check type information.

9. A design support method of a design support apparatus that supports designing of a circuit and includes a database storage that stores a first database including respective logical connection information for a first-layer circuit and a second-layer circuit laid lower than the first-layer circuit, both provided in the circuit, the design support method comprising:

tracing logical connection type identification information identifying types of logical connections from the first-layer circuit to the second-layer circuit based on the logical connection information included in the first database;

generating a layer terminal information file that includes layer terminal code information associating layer terminals in the second-layer circuit with layer terminal codes having trace information regarding the logical connection type identification information; and generating a second database based on the generated layer terminal information file and the logical connection information for the second-layer circuit for the second-layer circuit that includes placement information for a plurality of cells included in the circuit and wiring information for wiring among the plurality of cells.

10. A non-transitory computer-readable medium storing a design support program for supporting designing of a circuit that directs a computer includes a database storage that stores a first database including respective logical connection information for a first-layer circuit and a second-layer circuit laid lower than the first-layer circuit, both provided in the circuit to execute a procedure, the procedure comprising:

tracing logical connection type identification information identifying types of logical connections from the first-layer circuit to the second-layer circuit based on the logical connection information included in the first database;

generating a layer terminal information file that includes layer terminal code information associating layer terminals in the second-layer circuit with layer terminal codes having trace information regarding the logical connection type identification information; and generating a second database based on the generated layer terminal information file and the logical connection information for the second-layer circuit for the second-layer circuit that includes placement information for a plurality of cells included in the circuit under design and wiring information for wiring among the plurality of cells.

\* \* \* \* \*